(12) United States Patent
Terada et al.

(10) Patent No.: US 9,927,507 B2
(45) Date of Patent: Mar. 27, 2018

(54) GRADIENT MAGNETIC FIELD COIL DEVICE AND MAGNETIC RESONANCE IMAGING DEVICE

(71) Applicant: Hitachi, Ltd., Tokyo (JP)

(72) Inventors: Masanao Terada, Tokyo (JP); Mitsushi Abe, Tokyo (JP); Yukinobu Imamura, Tokyo (JP); Akira Kurome, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 511 days.

(21) Appl. No.: 14/411,120

(22) PCT Filed: Jun. 27, 2013

(86) PCT No.: PCT/JP2013/067674
§ 371 (c)(1),
(2) Date: Dec. 24, 2014

(87) PCT Pub. No.: WO2014/003126
PCT Pub. Date: Jan. 3, 2014

(65) Prior Publication Data
US 2015/0137814 A1    May 21, 2015

(30) Foreign Application Priority Data

Jun. 27, 2012 (JP) ................................. 2012-143714

(51) Int. Cl.
*G01R 33/385* (2006.01)
*G01R 33/022* (2006.01)
(Continued)

(52) U.S. Cl.
CPC .......... *G01R 33/385* (2013.01); *G01R 33/022* (2013.01); *G01R 33/34* (2013.01); *G01R 33/56518* (2013.01)

(58) Field of Classification Search
CPC .... G01R 33/385; G01R 33/022; G01R 33/34; G01R 33/56518
See application file for complete search history.

(56) References Cited

U.S. PATENT DOCUMENTS

| 5,424,643 A | 6/1995 | Morich et al. |
| 5,568,051 A | 10/1996 | Yamagata |

(Continued)

FOREIGN PATENT DOCUMENTS

| CN | 1504760 A | 6/2004 |
| JP | 10-216102 A | 6/1995 |

(Continued)

OTHER PUBLICATIONS

Chinese Office Action received in corresponding Chinese Application No. 201380033769.7 dated Jun. 17, 2015.

*Primary Examiner* — Rodney Bonnette
(74) *Attorney, Agent, or Firm* — Mattingly & Malur, PC

(57) ABSTRACT

A gradient magnetic field coil device is provided in which an eddy current magnetic field of an even-ordered component can be reduced. The gradient magnetic field coil device includes a forward coil and a reverse coil which faces the forward coil so as to sandwich a middle surface and through which flows an electric current directed opposite to the forward coil. The forward coil and the reverse coil have a middle region approaching the middle surface and an outside-the-middle region where the distance from the middle surface is greater than the middle region. A line width of coil lines in the middle region is narrower than a line width of coil lines in the outside-the-middle region.

19 Claims, 14 Drawing Sheets

(51) Int. Cl.
   *G01R 33/34*      (2006.01)
   *G01R 33/565*     (2006.01)

(56) References Cited

U.S. PATENT DOCUMENTS

| | | | |
|---|---|---|---|
| 5,952,830 A * | 9/1999 | Petropoulos | G01R 33/385 324/318 |
| 6,311,389 B1 | 11/2001 | Uosaki et al. | |
| 2004/0150401 A1 | 8/2004 | Eberler et al. | |
| 2010/0194393 A1 | 8/2010 | Abe et al. | |
| 2010/0321019 A1 | 12/2010 | Imamura et al. | |
| 2012/0176137 A1 * | 7/2012 | Terada | G01R 33/385 324/322 |
| 2013/0175975 A1 | 7/2013 | Shinozaki | |

FOREIGN PATENT DOCUMENTS

| | | |
|---|---|---|
| JP | 07-303624 A | 11/1995 |
| JP | 2000-082627 A | 3/2000 |
| JP | 2009-183386 A | 8/2009 |
| JP | 2012-024451 A | 2/2012 |
| WO | 2012/014941 A1 | 2/2012 |

* cited by examiner

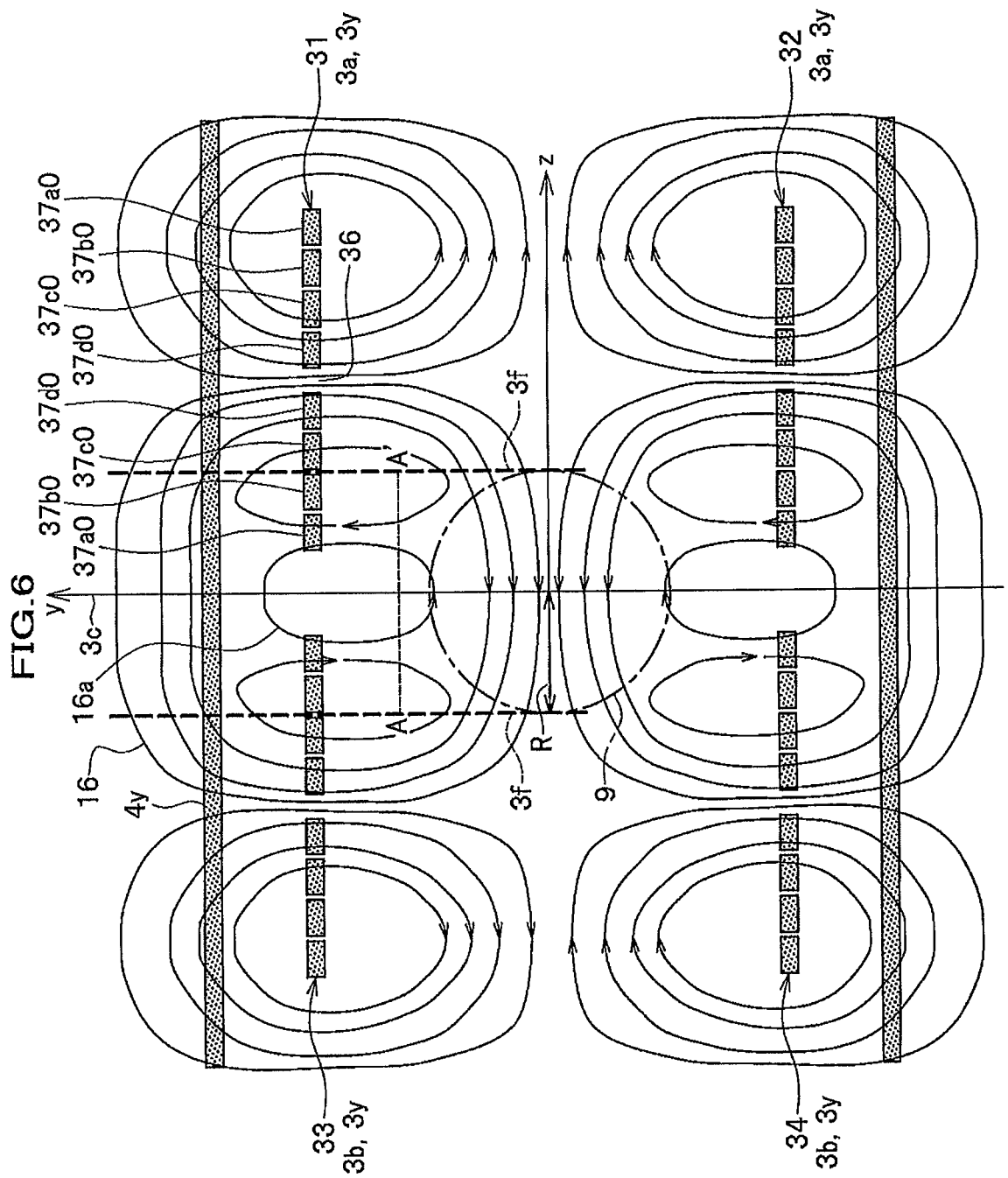

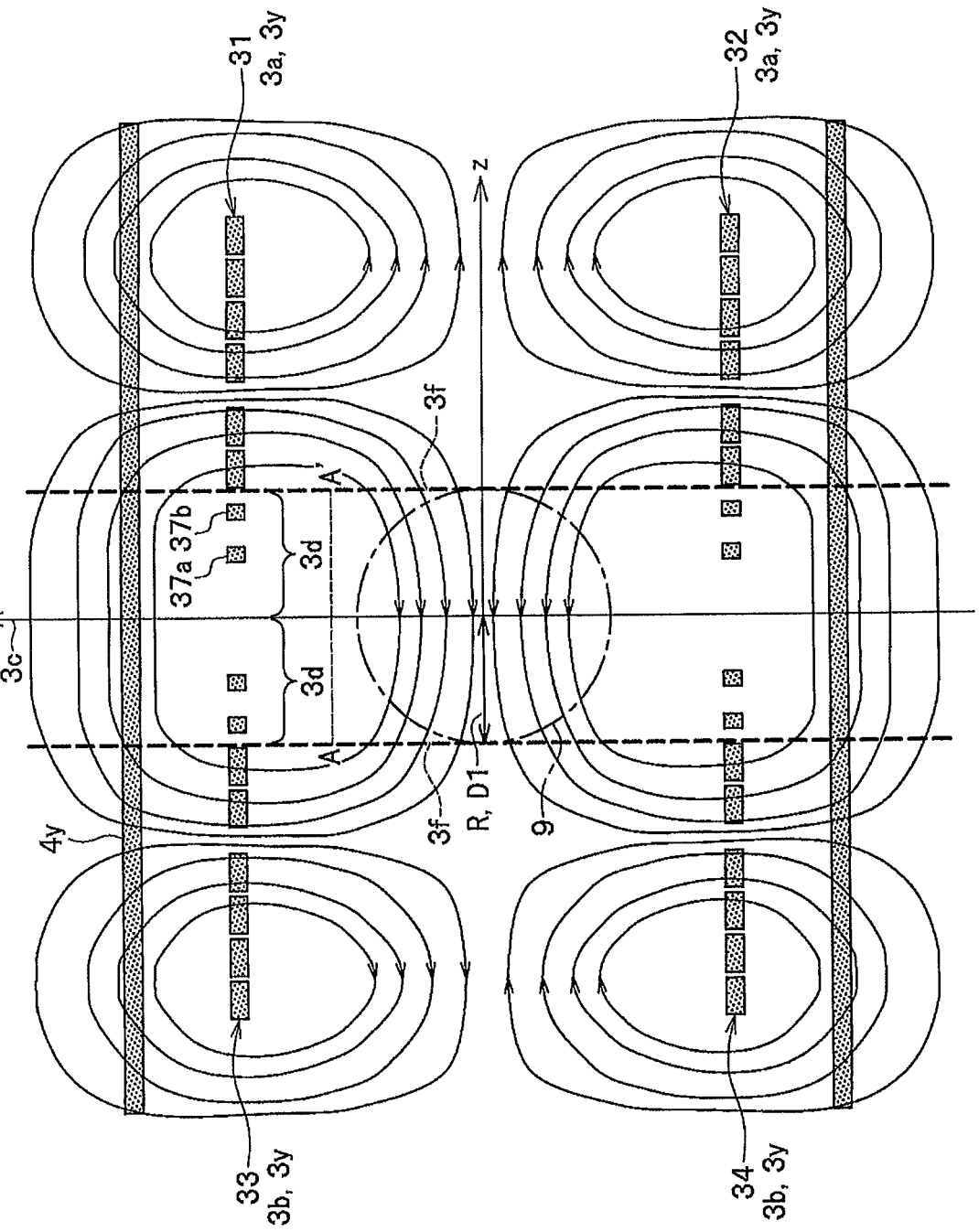

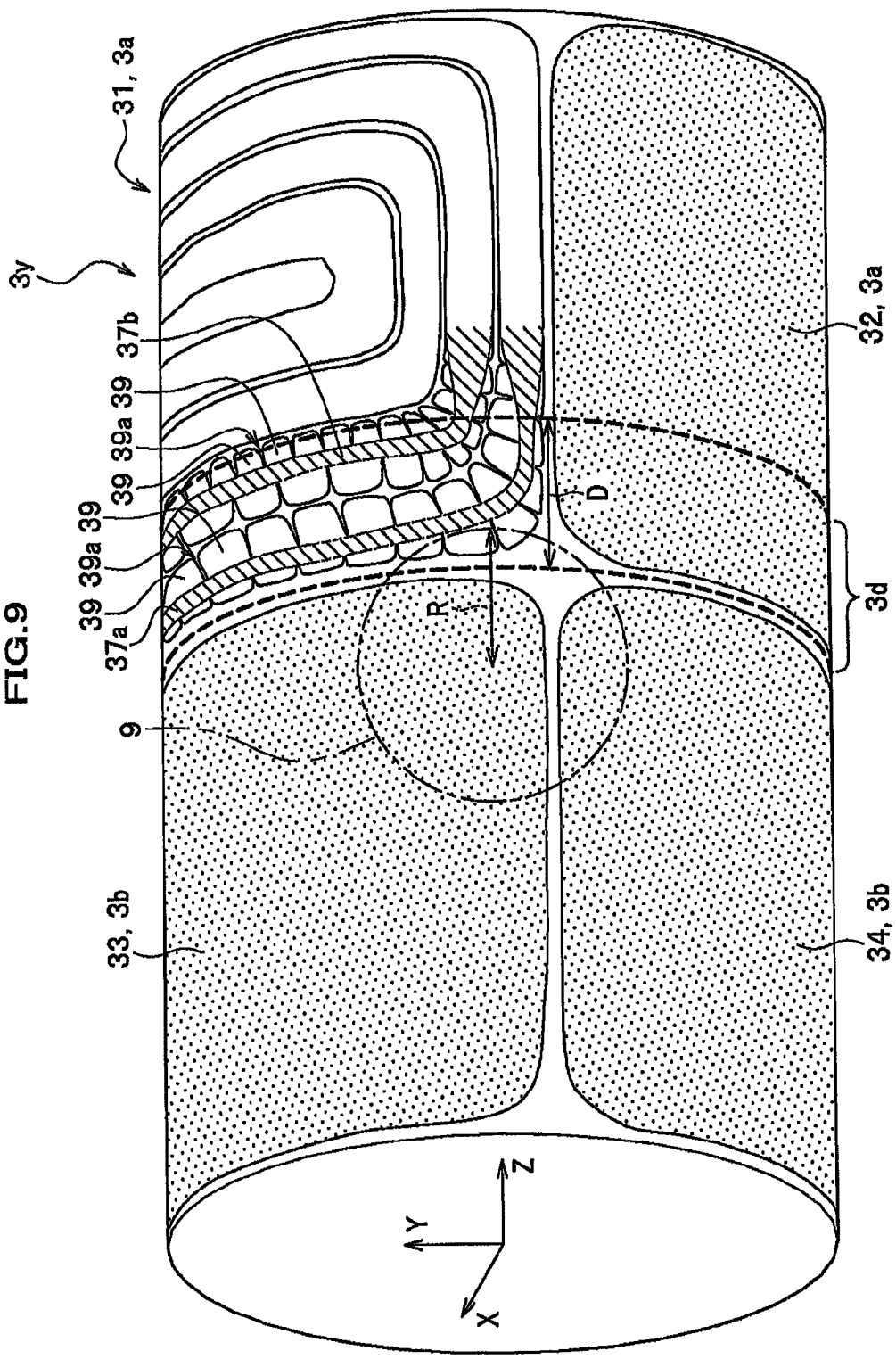

GRADIENT MAGNETIC FIELD COIL DEVICE AND MAGNETIC RESONANCE IMAGING DEVICE

TECHNICAL FIELD

The present invention relates to a gradient magnetic field coil device and a magnetic resonance imaging (hereinafter, referred to as MRI; Magnetic Resonance Imaging) device provided with the same.

BACKGROUND ART

On an MRI device, a subject (usually a human body) is inserted into a uniform static magnetic field generated by a static magnetic field coil (such as a superconductive coil) in an inner image capturing space. The MRI device irradiates the human body with RF pulses generated by an RF coil for exciting nuclear spins; thereby receives magnetic resonance signals generated from an inside of the body of the subject; and thus obtains a topographic image for medical diagnosis. Herein, a gradient magnetic field coil device generates a gradient magnetic field (with a primary gradient), which is temporally pulsed and spatially gradient, and makes addition of three-dimensional position information in the subject laid in the image capturing space.

In recent years, in order to obtain a high image quality of the above-described topographic image and shorten the image capturing time, a high gradient magnetic field intensity and high speed driving are required of a gradient magnetic field coil device. Improvement of the performance of the power source for a gradient magnetic field, and the like, has made it possible to realize these requirements by applying a large intensity current to the gradient magnetic field coil device and switching at a high speed. Accompanying this realization, when a pulsed gradient magnetic field is generated, eddy currents flowing in conductors such as a gradient magnetic field coil device also become high, and heat generation by the eddy currents and the magnetic field generated by the eddy currents (eddy current magnetic field) become significant. As an eddy current magnetic field distorts the gradient magnetic field in an image capturing space, the image quality of the above-described topographic image may be deteriorated. Particularly, components of even orders higher than or equal to the secondary order of an eddy current magnetic field need to be made low because they cannot be compensated by a correction pulse, which is of a primary component, for correcting the gradient magnetic field. In this situation, it is offered to dispose a conductive ring so that the even order components substantially become zero by an eddy current magnetic field (for example, refer to Patent Document 1). Further, in order to reduce heat generation by eddy currents, it is also offered to decrease the width of a coil conductor in a region where the interlinked gradient magnetic field is intensive (for example, Patent Document 2 and the like).

RELATED ART DOCUMENTS

Patent Documents

Patent Document 1: Japanese Patent Application Publication No. H10-216102
Patent Document 2: Japanese Patent Application Publication No. 2009-183386

DISCLOSURE OF THE INVENTION

Problems to be Solved by the Invention

In order to make eddy currents low in the coil conductors of a gradient magnetic field coil device, narrowing the widths of the coil conductors, with which the magnetic field is interlinked, is effective, however, heat generation cannot be neglected in a high-current application for obtaining a high gradient magnetic field intensity, which has a limitation. In this situation, while the widths of coil conductors are made narrowed, if the thicknesses of the coil conductors are made large, heat generation can be reduced. However, it is necessary to widen the image capturing space so as not to give a subject a feeling of a closed space, and necessary to compact a static magnetic field coil device as much as possible because of the limitation of the space for installing the device. Accordingly, the gradient magnetic field coil device installed between the static magnetic field coil device and the image capturing space cannot be made thick and the coil conductors cannot be made thick. Making the coil conductors thick does not make it possible to narrow the widths of the coil conductors. Small width of a coil conductor enables reduction in eddy currents, and large width of a coil conductor enable reduction in heat generation in applying high current, however, there is no width that enables sufficient reduction in the both, which are in a trade-off relation.

By reducing the above-described eddy currents, heat generation by the eddy currents can be reduced and the eddy current magnetic field can be reduced. Thus, it is possible to reduce the eddy current magnetic field of components of even orders higher than or equal to the secondary order, which cannot be cancelled nor compensated by correction of a gradient magnetic field even when the eddy current magnetic field is reduced, and the image quality of the above-described tomogram can be thereby improved. Conversely, it has been thought that the above-described trade-off relation can be reduced by focusing the reduction in eddy currents on the reduction in the components of even orders higher than or equal to the secondary order in the eddy current magnetic field. That is, while unchanging the widths of coil conductors in which eddy currents generating an eddy current magnetic field of components of even orders higher than or equal to the secondary order do not flow, the widths of coil conductors, in which eddy currents generating an eddy current magnetic field of components of even orders being the secondary order and higher flow, are narrowed. As portions where heat is generated become partial, heat generation by eddy currents can also be reduced. In this situation, the inventors have made clear the differentiation between coil conductors in which eddy currents generating an eddy current magnetic field of components of even orders higher than or equal to the secondary order and other coil conductors, and thus completed the present invention.

In this situation, an object of the present invention is to provide a gradient magnetic field coil device capable of reducing an eddy current magnetic field of components of even orders, and to provide an MRI device capable of improving the image quality of the above-described topographic image by mounting this gradient magnetic field coil device.

Means for Solving the Problems

In order to solve the above-described problems, a gradient magnetic field coil device includes: a forward coil; and a reverse coil that faces the forward coil such as to sandwich a central plane and generates a gradient magnetic field in a periphery of the central plane by application of a current in a direction reverse to a direction of a current applied to the forward coil, wherein at least one coil of the forward coil and the reverse coil includes a central region adjacent to a central axis of the coil or the central plane, and includes a outside-central region at a larger distance than a distance of the central region, from the central axis of the coil or the central plane, and wherein a wire width, in the central region, of a coil wire of the coil is smaller than a wire width, in the outside-central region, of the coil wire of the coil. Further, a magnetic resonance imaging device according to the invention is featured by having this gradient magnetic field coil device mounted thereon.

Advantageous Effect of the Invention

According to the present invention, it is possible to provide a gradient magnetic field coil device capable of reducing an eddy current magnetic field of components of even orders. Further, it is possible to provide an MRI device capable of improving the image quality of the above-described tomogram by mounting this gradient magnetic field coil device. Objects, arrangements, and advantages other than the above will be made clear by the description of the following embodiment.

BRIEF DESCRIPTION OF THE DRAWINGS

FIG. 6 is a distribution diagram of magnetic field lines on the y-z plane in magnetic fields generated by eddy currents generated in the coil conductor of the y-direction gradient magnetic field main coil by a magnetic field generated by application of a current in the own y-direction gradient magnetic field main coil and the y-direction gradient magnetic field shield coil in a comparative example;

FIG. 7 is a distribution diagram of magnetic field lines on the y-z plane of magnetic field generated by eddy currents generated in the coil conductor of the y-direction gradient magnetic field main coil by a magnetic field generated by applying a current to the own y-direction gradient magnetic field main coil and the y-direction gradient magnetic field shield coil of a gradient magnetic field coil device in the first embodiment of the present invention;

FIG. 9 is a perspective view of a y-direction gradient magnetic field main coil of a magnetic resonance imaging device (gradient magnetic field coil device) in a second embodiment of the present invention;

EMBODIMENTS FOR CARRYING OUT THE INVENTION

Figure 1:
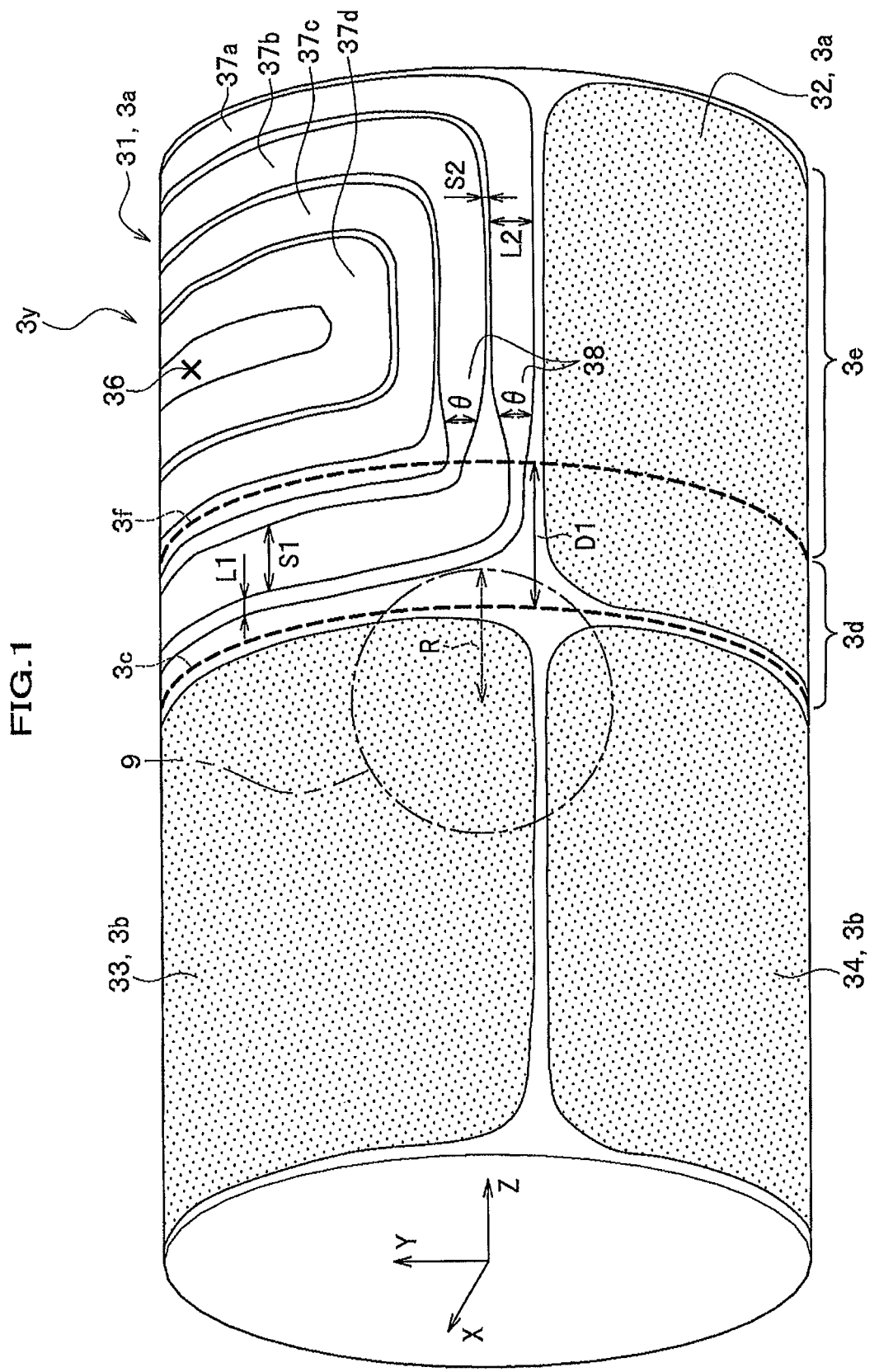
FIG. 1 is a perspective view of a y-direction gradient magnetic field main coil of a magnetic resonance imaging device (gradient magnetic field coil device) in a first embodiment of the present invention.

Embodiments according to the present invention will be described below, referring to the drawings, as appropriate. Incidentally, in the drawings, the same reference symbols will be assigned to elements common to respective drawings, and overlapping description will be omitted.

First Embodiment

Figure 2:
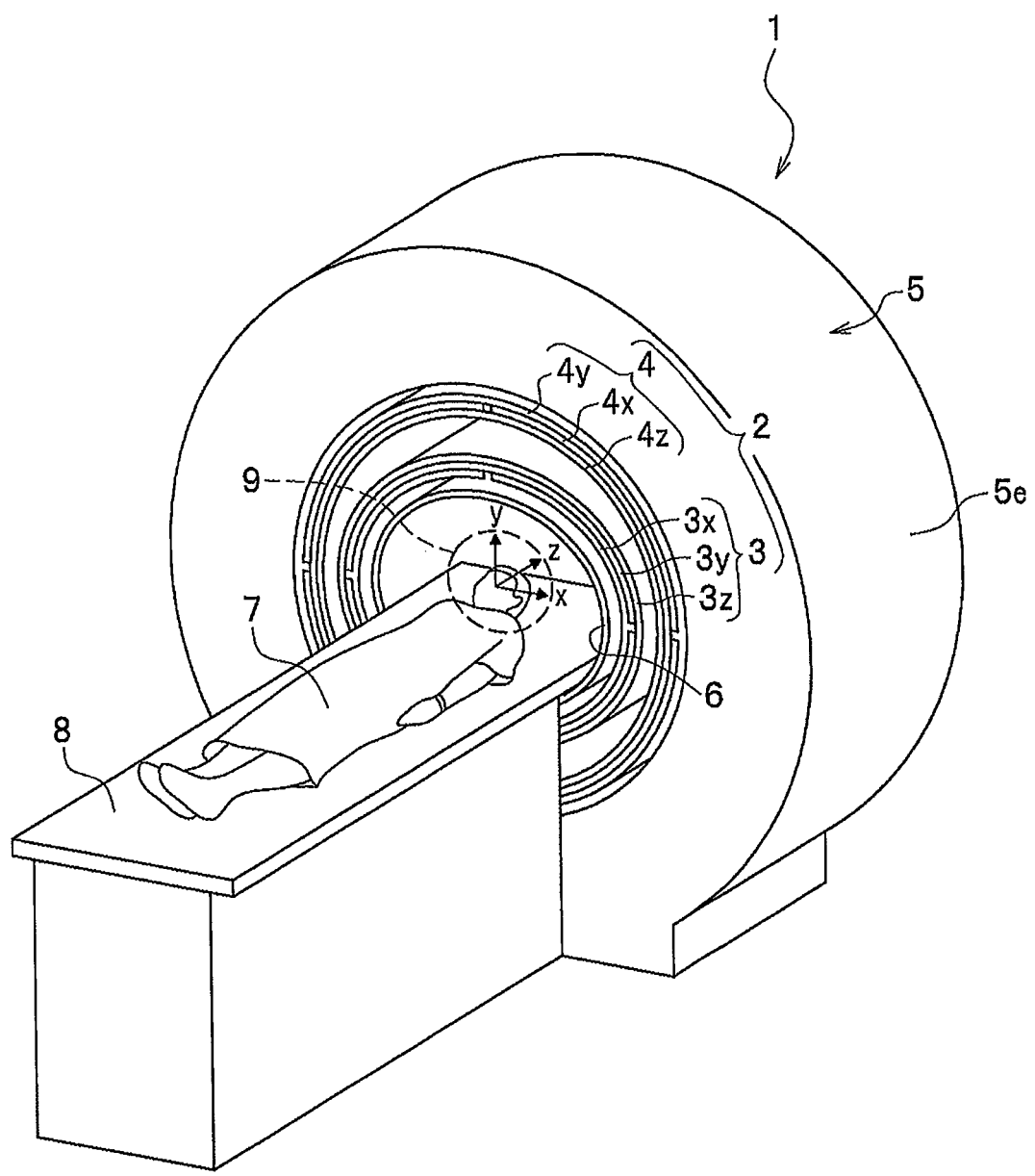
FIG. 2 is a perspective view of the magnetic resonance imaging device in the first embodiment of the present invention.

FIG. 2 is a perspective view of a MRI (magnetic resonance imaging) device 1 in the first embodiment of the present invention. The MRI device 1 includes a bed 8 on which a subject 7 in a state of lying is inserted into an image capturing space 9 enclosed by a static magnetic field coil device 5, the static magnetic field coil device 5 for generating a uniform static magnetic field in the image capturing space 9, a gradient magnetic field coil device 2 for generating a pulsed gradient magnetic field whose magnetic field intensity is spatially inclined with gradient to assign position information to the image capturing space 9, a RF coil 6 for irradiating the subject 7 with high frequency pulses, a receiving coil (not shown) for receiving magnetic resonance signals from the subject 7, and a computer system (not shown) that processes the received magnetic resonance signals and displays the above-described topographic image. By the MRI device 1, using nuclear magnetic resonance phenomenon occurring by irradiating the subject 7, who is laid in a uniform static magnetic field, with a high frequency pulse, a topographic image representing the physical and chemical characteristics of the subject 7 can be obtained, wherein the topographic image is used particularly for medical purposes. The static magnetic field coil device 5, the gradient magnetic field coil device 2, and the RF coil 6 are in a tube shape, and the central axes of the tube shapes are substantially the same with each other and also the same as z-axis. Incidentally, y-axis direction is set vertically and upward. X-axis is set horizontally, and is set in the direction to which a right screw moves when the right screw is turned from y-axis direction to z-axis direction. The origins of these axial coordinates are set at the centers of their tubed shapes. The outer circumference of the static magnetic field coil device 5 is formed by a vacuum housing 5e, which is a hollow cylindrical housing. The gradient magnetic field coil device 2 and the RF coil 6 are disposed inside the cylinder inner wall of the vacuum housing 5e, which is a hollow cylindrical housing, and outside the vacuum housing 5e, which is a hollow cylindrical housing.

The gradient magnetic field coil device 2 includes a gradient magnetic field main coil 3 disposed on the image capturing space 9 side and a gradient magnetic field shield coil 4 disposed on the vacuum housing 5e side. The gradient magnetic field main coil 3 generates a gradient magnetic field in the image capturing space 9, but at the same time also generates a so-called leakage magnetic field in the vacuum housing 5e, which is a hollow cylindrical housing. In order to reduce the leakage magnetic field generated into the vacuum housing 5e, the gradient magnetic field shield coil 4 is arranged in such a manner that a current flows in the gradient magnetic field shield coil 4 in a direction reverse to the current flow direction in the gradient magnetic field main coil 3.

The gradient magnetic field main coil 3 includes a z-direction gradient magnetic field main coil 3z for generating a gradient magnetic field whose magnetic field intensity varies linearly in z-axis direction, a x-direction gradient magnetic field main coil 3x for generating a gradient magnetic field whose magnetic field intensity varies linearly in x-axis direction, and a y-direction gradient magnetic field main coil 3y for generating a gradient magnetic field that varies linearly in y-axis direction. By sequentially applying pulsed currents to the z-direction gradient magnetic field main coil 3z, the x-direction gradient magnetic field main coil 3x, and the y-direction gradient magnetic field main coil 3y, it is possible to generate gradient magnetic fields that are inclined in the respective corresponding directions, and attach information of a position inside the subject 7 to each corresponding magnetic resonance signal.

The gradient magnetic field shield coil 4 includes a z-direction gradient magnetic field shield coil 4z for reducing the leakage magnetic field generated by the z-direction gradient magnetic field main coil 3z, a x-direction gradient magnetic field shield coil 4x for reducing the leakage magnetic field generated by the x-direction gradient magnetic field main coil 3x, and a y-direction gradient magnetic field shield coil 4y for reducing the leakage magnetic field generated by the y-direction gradient magnetic field main coil 3y. The gradient magnetic field shield coil 4 (4x, 4y, 4z) is arranged such as to cover the gradient magnetic field main coil 3 (3x, 3y, 3z) and thus reduce the leakage magnetic fields, to outside, generated by the gradient magnetic field main coil 3 (3x, 3y, 3z).

Figure 3:
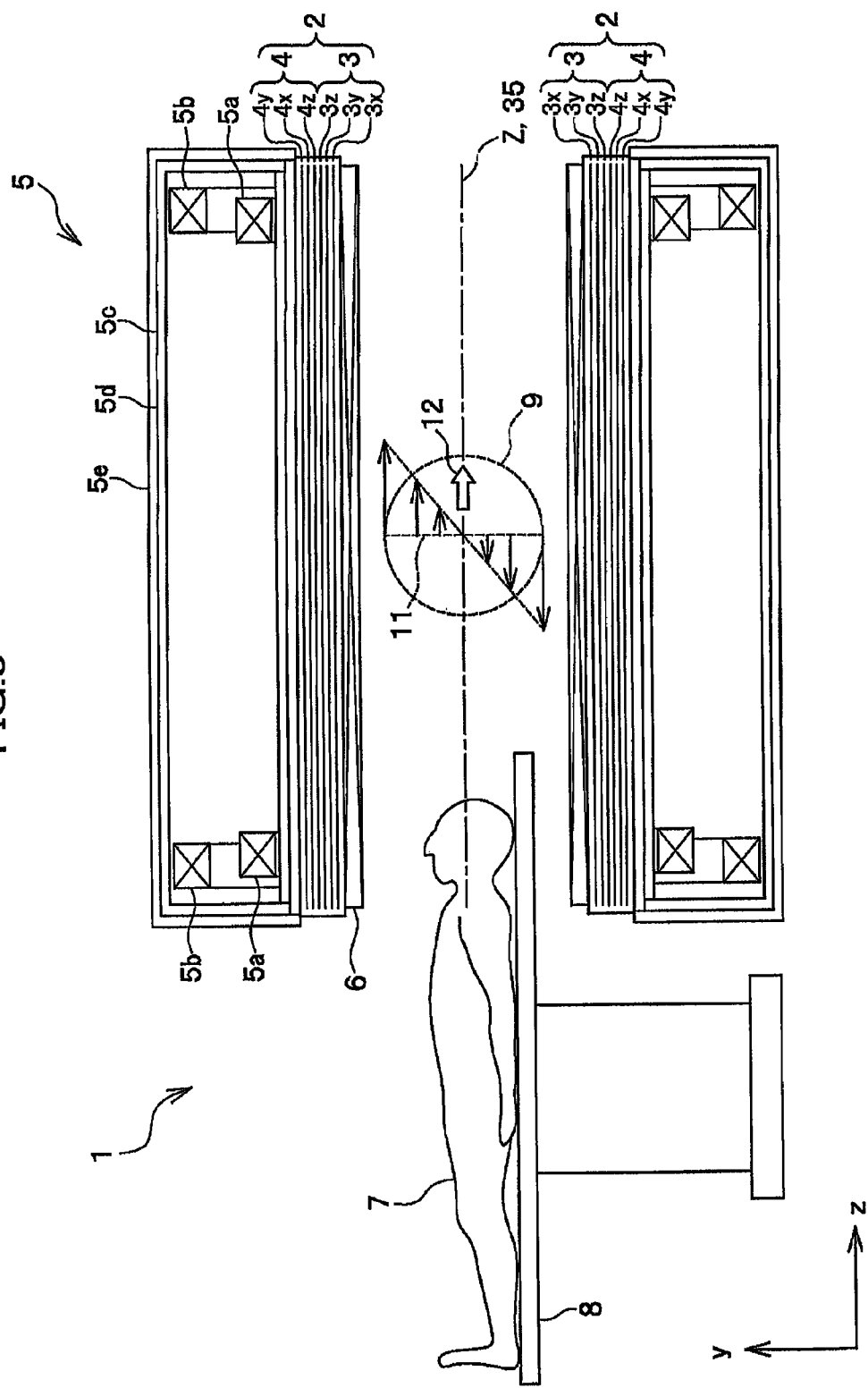
FIG. 3 is a cross-sectional view of the magnetic resonance imaging device, in the first embodiment of the present invention, cut by y-z plane including the central axis (z axis)

FIG. 3 is a cross-sectional view of the MRI device 1 in the first embodiment of the present invention, obtained by cutting the MRI device 1 with y-z plane including the central axis 35 (z-axis). The MRI device 1 is a horizontal magnetic field MRI device, wherein the direction of a static magnetic field 12 formed in the image capturing space 9 is the horizontal direction (z-axis direction). Further, as described above, x-axis, y-axis, and z-axis are set such as to be perpendicular to each other, and the origin is set near the center of the image capturing space 9, in other words, near the center of the vacuum housing 5e, which is a hollow cylindrical housing. The static magnetic field coil device 5 is provided with static magnetic field main coils 5a, and static magnetic-field shield coils 5b for reducing leakage of a static magnetic field to the periphery of the static magnetic field, such that the static magnetic field coils 5a and the static magnetic field shield coils 5b are respectively left-right (portions z<0 and z>0) symmetric with respect to z=0 plane (x-y plane including x-axis and y-axis). These coils 5a, 5b are in annular shapes with z-axis as the common central axis. The inner diameters of the static magnetic field shield coils 5b are larger than the outer diameters of the static magnetic field main coils 5a. In most cases, superconductive coils are used for these coils 5a, 5b, wherein the coils 5a, 5b are housed in a housing with a three-layer structure. First, the coils 5a, 5b are housed in a helium container 5c together with liquid helium (He) as refrigerant. The helium container 5c is housed in a radiation shield 5d for shielding heat radiation thereinto. The vacuum housing 5e, which is a hollow cylindrical housing, houses the helium container 5c and the radiation shield 5d, while maintaining the inside thereof vacuum. As the inside of the vacuum housing 5e is maintained vacuum, even when the vacuum housing 5e is set in a room at a normal room temperature, it does not occur that the heat inside the room is transferred to the helium container 5c by conduction or convection. Further, the radiation shield 5d reduces transfer of the heat in the room through the vacuum housing 5e to the helium container 5c by radiation. Accordingly, the coils 5a, 5b can be set stably at an ultralow temperature, which is the temperature of the liquid helium, to enable a function as a superconductive electromagnet. In order that an unnecessary magnetic field is not generated, nonmagnetic materials are employed for the helium container 5c, the radiation shield 5d, and the vacuum housing 5e. Incidentally, as the leakage magnetic field generated by the gradient magnetic field main coil 3 is shielded by the gradient magnetic field shield coil 4 to hardly reach the helium container 5c, the radiation shield 5d, and the vacuum housing 5e so that eddy currents are hardly generated. The static magnetic field coil device 5 generates a static magnetic field 12 in the image capturing space 9, superimposing a gradient magnetic field 11 on the image capturing space 9.

The gradient magnetic field coil device 2 has a tube shape and is arranged such as to surround the RF coil 6 and the image capturing space 9 therein. The outer cylindrical wall of the gradient magnetic field coil device 2 is formed such as to face along the inner cylindrical wall of the vacuum housing 5e, which is a hollow cylindrical housing. The gradient magnetic field coil device 2 includes the z-direction gradient magnetic field main coil 3z, the x-direction gradient magnetic field main coil 3x, and the y-direction gradient magnetic field main coil 3y. FIG. 3 shows an example where the y-direction gradient magnetic field main coil 3y generates a gradient magnetic field 11 whose magnetic intensity linearly varies along the y-axis direction. The RF coil 6 also has a hollow cylindrical shape and is disposed such as to enclose the image capturing space 9 therein. The outer cylindrical wall of the RF coil 6 is formed such as to face along the inner cylindrical wall of the gradient magnetic field coil device 2.

FIG. 1 shows a perspective view of the y-direction gradient magnetic field main coil 3y. The y-direction gradient magnetic field main coil 3y includes forward coils 3a (31, 32) and reverse coils 3b (33, 34) in such a manner that the forward coils 3a and the reverse coils 3b face each other, sandwiching a central plane 3c therebetween. Current flow in the reverse coils 3b (33, 34), the currents being in the direction reverse to the direction of the currents flowing in the forward coils 3a (31, 32). Thus, a gradient magnetic field whose magnetic field intensity is inclined in the y direction can be generated in the image capturing space 9 in the periphery of the central plane 3c. The central plane 3c can be disposed such as to agree with plane z=0 (x-y plane including x-axis and y-axis).

The above-described forward coils 3a include the first forward coil 31 and the second forward coil 32 that is disposed on the first forward coil 31 side with respect to the central plane 3c and faces the first forward coil 31. The above-described reverse coils 3b include the first reverse coil 33 that is disposed on the side opposite to the first forward coil 31 with respect to the central plane 3c, and the second reverse coil 34 that is disposed on the side of the first reverse coil 33 with respect to the central plane 3c. The first forward coil 31, the second forward coil 32, the first reverse coil 33, and the second reverse coil 34 are spiral-saddle-shaped coils formed along a tube shape. Incidentally, the cross-sectional shapes perpendicular to the central axis of the tube, along which the first forward coil 31, the second forward coil 32, the first reverse coil 33, and the second reverse coil 34 are disposed, are not limited to a circular shape, and may be an elliptical shape or a race-track shape. By making the cross-sectional shapes be an elliptical shape or a race-track shape, the x-direction width of the y-direction gradient magnetic field main coil $3y$ can be made wider than the width in y direction. As it is possible to widen the x-direction width, x direction being the direction of the shoulder-width of the subject 7, the subject 7 can enter the image capturing space 9 in a natural posture.

As shown in FIG. 1, the coil pattern of the first forward coil 31 is a spiral pattern of plural turns (four turns in the example in FIG. 1) for which a coil wire 37a, a coil wire 37b, a coil wire 37c, and a coil wire 37d are disposed inner in this order. The coil pattern of the second forward coil 32 is not shown in FIG. 1, and is substantially plane-symmetrical to the coil pattern of the first forward coil 31 about the y=0 plane (the z-x plane including z-axis and x-axis) as the plane of symmetry. The coil pattern of the first reverse coil 33 is not shown in FIG. 1, and is substantially plane symmetrical to the coil pattern of the first forward coil 31 about the z=0 plane (the x-y plane including x-axis and y-axis) as the plane of symmetry. The coil pattern of the second reverse coil 34 is not shown in FIG. 1, and is substantially symmetrical to the coil pattern of the first reverse coil 33 about y=0 plane (z-x plane including z-axis and x-axis) as the plane of symmetry. That is, the coil patterns of the second forward coil 32, the first reverse coil 33, and the second reverse coil 34 can be guessed from the coil pattern of the first forward coil 31. Incidentally, in order to be formed thin in thickness, the first forward coil 31, the second forward coil 32, the first reverse coil 33, and the second reverse coil 34 are manufactured by cutting plate of a good conductor, such as copper (CU) or aluminum (Al), into spiral coil wires. As a method of cutting a plate into a spiral shape, cutting by etching, water jet, punching, or the like can be used. Based on current distribution optimally designed to form a desired gradient magnetic field, a plate is processed such as to form a conductive region by a region cut out and separated for a required individual maximum current value. A cut-out coil wire is subjected to roll bending to match with the shape of a tube (tunnel) into a saddle-shaped coil.

The coil pattern of the first forward coil 31 will be described later in detail. The first forward coil 31 includes a central region 3d adjacent to the central plane 3c and an outside-central region 3e at a larger distance than the central region 3d from the central plane 3c. The spiral first forward coil 31 includes a spiral center 36 further inner than the most inner coil wire 37d. The spiral center 36 is arranged in the outside-central region 3e. The central region 3d is disposed closer to the central plane 3c than the spiral center 36 is. The coil wires 37a, 37b on the outer side are disposed such as to straddle the central region 3d and the outside-central region 3e. The coil wires 37c, 37d, which are inside the coil wires 37a, 37b, are disposed in the outside-central region 3e. The coil wires 37a, 37b in the central region 3d are arranged along the central plane 3c.

The wire width L1 of the coil wires 37a, 37b in the central region 3d is smaller than the wire width L2 of the coil wires 37a, 37b, 37c, and 37d in the outside-central region 3e (L1<L2). The interval S1 between the coil wires 37a and 37b in the central region 3d is wider than the interval S2 between the coil wires 37a, 37b, 37c, and 37d in the outside-central region 3e (S1>S2). The wire width L1 of the coil wires 37a, 37b in the central region 3d is smaller than the interval S1 between the coil wires 37a and 37b in the central region 3d (L1<S1). The wire width L2 of the coil wires 37a, 37b, 37c, and 37d in the outside-central region 3e is larger than the interval S2 between the coil wires 37a, 37b, 37c, and 37d in the outside-central region 3e (L2>S2).

The central region 3d and the outside-central region 3e are partitioned by a boundary surface 3f. The boundary surface 3f can be disposed such as to agree with z=D1 plane (x-y plane distant from the z=0 plane by distance D1). The boundary surface 3f is parallel with the central plane 3c. The outer coil wires 37a, 37b penetrate through the boundary surface 3f between the central region 3d and the outside-central region 3e. The coil wires 37a, 37b has a taper (gradient portion) 38 with a taper angle (gradient angle) θ in a range from 20 degrees to 160 degrees near the boundary surface 3f. This makes it possible to rapidly narrow the wire width of the coil wires 37a, 37b. The tape angle θ is preferably in a range from 30 degrees to 120 degrees. With the taper 38, the wire width of the outer coil wires 37a, 37b gradually becomes smaller as going from the outside-central region 3e to the central region 3d. On the other hand, the coil wires 37c, 37d inside the coil wires 37a, 37b are distant from the boundary surface 3f.

Figure 4:
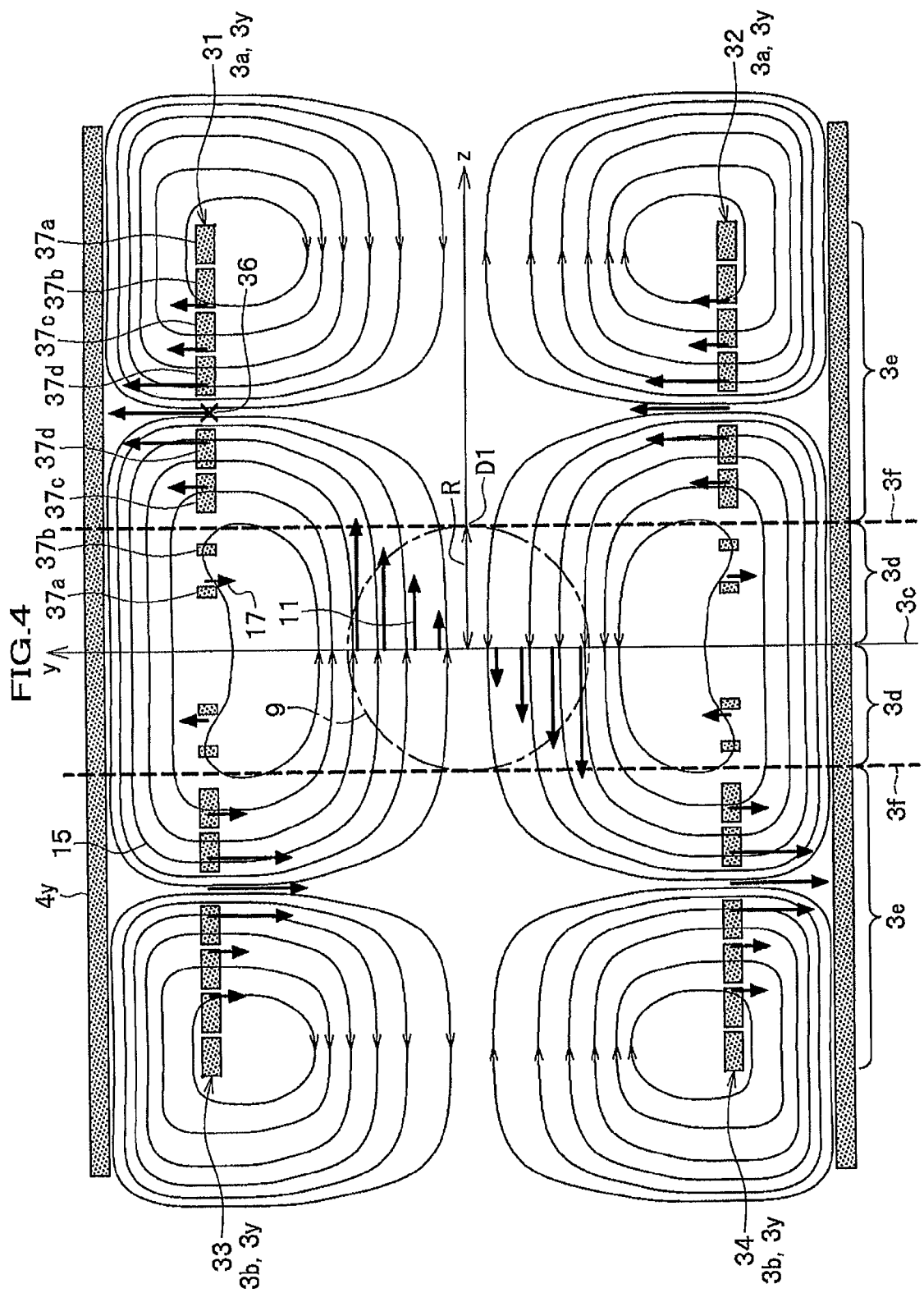
FIG. 4 is a distribution diagram of magnetic field lines and magnetic flux density of magnetic field (including a gradient magnetic field) on the y-z plane generated by application of a current to the y-direction gradient magnetic field main coil and a y-direction gradient magnetic field shield coil.

FIG. 4 is a distribution diagram of magnetic field lines 15 and magnetic flux density y-component 17, on y-z plane of magnetic field (including a gradient magnetic field) generated by application of a current to the y-direction gradient magnetic field main coil $3y$ and the y-direction gradient magnetic field shield coil $4y$. The gradient magnetic field 11 having a primary gradient of the z-direction magnetic field intensity is generated in the image capturing space 9. A magnetic field (y-direction magnetic flux density 17 on the y-direction gradient magnetic field main coil $3y$) exists, interlinked with the y-direction gradient magnetic field main coil $3y$. The y-direction magnetic flux density 17 has the local maximum at the position of the spiral center 36. The farther from the spiral center 36 a position is, the smaller the y-direction magnetic flux density 17 is. When the absolute value of z-coordinate becomes larger as a position goes farther from the spiral center 36, the y-direction magnetic flux density 17 decreases, however, the direction of the y-direction magnetic field is not reversed. On the other hand, when the absolute value of the z-coordinate becomes smaller as a position goes farther from the spiral center 36, the y-direction magnetic flux density 17 decreases, and further, the direction of the y-direction magnetic field is reversed. That is, when a design is made such that a gradient magnetic field 11 with a desired accuracy is generated in the image capturing space 9 and the coil magnetomotive force is minimized, the magnetic field in the y-direction (the reverse direction where the direction of the positive and the negative in the y-direction is reversed) reversed from the direction of the y-direction magnetic field generated at the position of the spiral center 36 is generated in the vicinity of the z=0 plane (x-y plane including x-axis and y-axis) in some cases. The magnetic field in this reversed direction is generated in the central region 3d.

Figure 5:
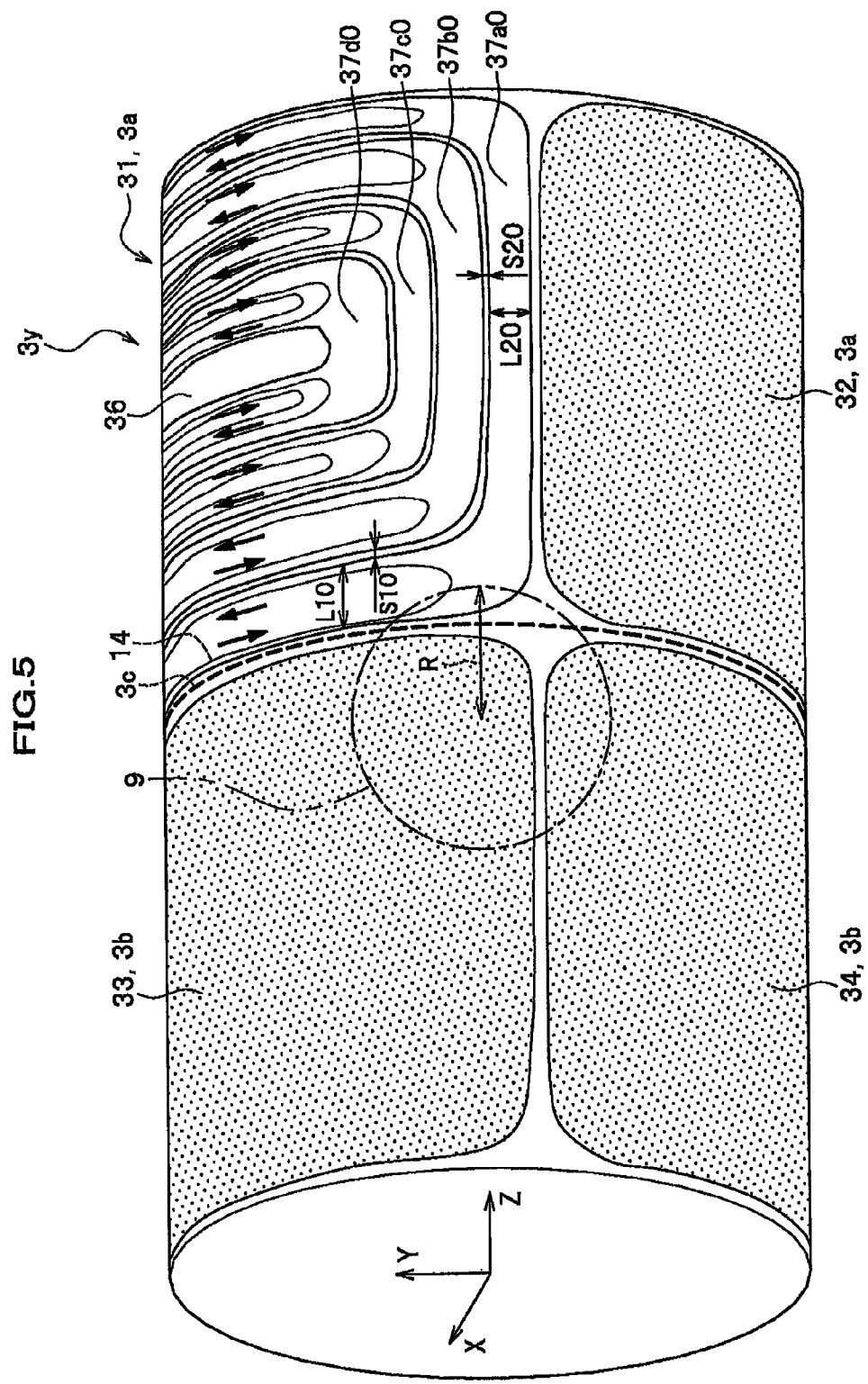
FIG. 5 is a perspective view of the y-direction gradient magnetic field main coil in a comparative example, and is a diagram showing the eddy current distribution in the coil.

FIG. 5 is a perspective view of a y-direction gradient magnetic field main coil 3y in a comparative example. The y-direction gradient magnetic field main coil 3y in the comparative example can also generate magnetic field lines 15 in the same pattern as that shown in FIG. 4 and distribution of magnetic flux density y-component 17 in the same pattern, similarly to the y-direction gradient magnetic field main coil 3y in the first embodiment. The difference of the y-direction gradient magnetic field main coil 3y in the comparative example from the y-direction gradient magnetic field main coil 3y in the first embodiment is that the wire widths L10 and L20 of coil wires 37a0, 37b0, 37c0, and 37d0 are substantially constant (L10=L20) and large, regardless of at which number of order of turn from the spiral center 36 a coil is and regardless of whether or not on the central plane 3c side the coil is. Further. the intervals S10, S20 between the coil wires 37a0, 37b0, 37c0, and 37d0 are substantially constant (S10=S20), regardless of at which number of order of turn from the spiral center 36 a coil is and regardless of whether or not on the central plane 3c side the coil is. Thus, eddy currents 14 are generated, as shown in FIG. 5, in coil wires 37a0, 37b0, 37c0, and 37d0 of the y-direction gradient magnetic field main coil 3y. In the periphery of the spiral center 36 and on the outer side, with respect to z-direction, of tube forming the outer shape of the y-direction gradient magnetic field main coil 3y, eddy currents 14, which are clockwise in a view from the outer side with respect to y-direction of the cylinder, are generated. On the other hand, in the region (corresponding to the central region 3d in FIG. 4) adjacent to the central plane 3c, counterclockwise eddy currents 14 are generated, corresponding to the magnetic field in the reverse direction in FIG. 4.

FIG. 6 is a distribution diagram of magnetic field lines 16, on y-z plane, of a magnetic field (eddy current magnetic field) that is generated by eddy currents 14 generated in the coil conductor of the y-direction gradient magnetic field main coil 3y itself by a magnetic field generated by application of a current in the own y-direction gradient magnetic field main coil 3y and the y-direction gradient magnetic field shield coil 4y in the comparative example. The magnetic field lines 16 generated in the periphery of the spiral center 36 are in a large number and dominant, however, are in a reverse direction and are distributed similarly to the magnetic field lines 15 in FIG. 4. Accordingly, this eddy current magnetic field (magnetic field lines 16) can be compensated by a gradient magnetic field correction pulse. On the other hand, the above-described counterclockwise eddy currents 14 generate an eddy current magnetic field (magnetic field lines 16a) in a direction reverse to the direction of the magnetic field lines 16, adjacent to z=0 plane (x-y plane including x-axis and y-axis). This magnetic field (magnetic field lines 16a) in the reverse direction cannot be compensated by a gradient magnetic field correction pulse.

FIG. 7 is a distribution diagram of the magnetic field lines 16 on y-z plane of the eddy current magnetic field generated by the eddy currents 14 generated in coil conductor of the y-direction gradient magnetic field main coil 3y itself by a magnetic field generated by applying a current to the own y-direction gradient magnetic field main coil 3y and the y-direction gradient magnetic field shield coil 4y in the first embodiment of the present invention. In the distribution diagram of the magnetic field lines 16 in FIG. 7, the eddy current magnetic field (magnetic field lines 16a) in the reverse direction in FIG. 6 has disappeared. As it is possible to remove the eddy current magnetic field (magnetic field lines 16a) in the above-described reverse direction, which cannot be compensated by a gradient magnetic field correction pulse, it is possible to provide a gradient magnetic field, with a high accuracy, compensated by a gradient magnetic field correction pulse. The eddy current magnetic field (magnetic field lines 16a) in the above-described reverse direction can be removed because generation of the above-described counterclockwise eddy currents 14 (see FIG. 5), which are the generation source of the eddy current magnetic field (magnetic field lines 16a), is reduced in the central region 3d where the eddy current magnetic field (magnetic field lines 16a) in the reverse direction is generated. This reduction in the above-described counterclockwise eddy currents 14 can be attained by narrowing the wire widths of the coil wires 37a, 37b in the central region 3d and widening the interval between them.

Figure 8A:
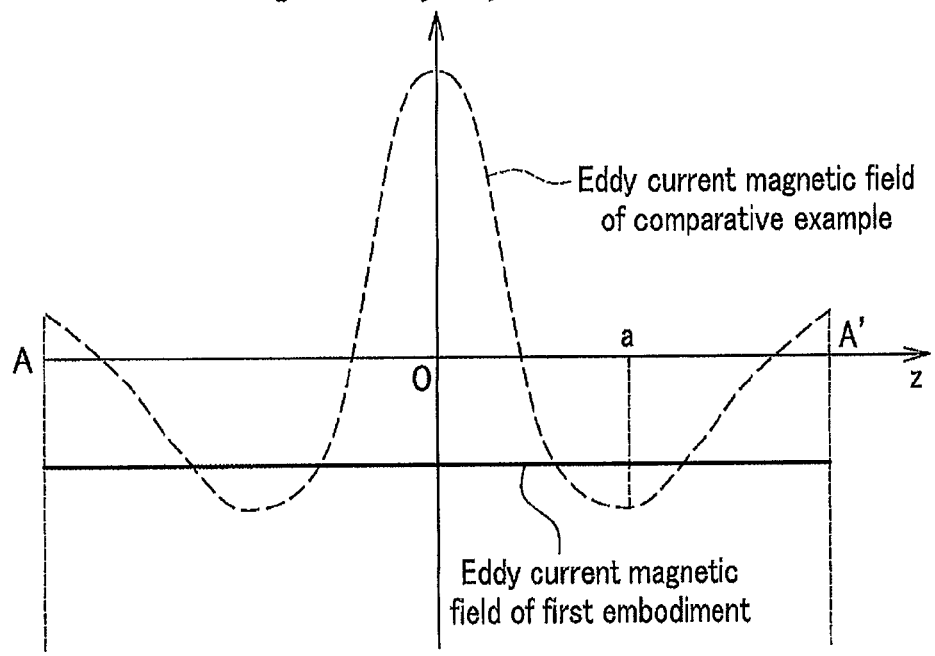
FIG. 8A is a distribution diagram of magnetic flux density of the z component of a magnetic field generated by eddy currents on the line between A-A' in FIG. 6 and FIG. 7 (solid line: present invention (FIG. 7), dashed curve: comparative example (FIG. 6))

FIG. 8A is a distribution diagram of magnetic flux density of the z component of the magnetic field (eddy current magnetic field) generated by eddy currents on the line between A-A' in FIG. 6 and FIG. 7 (solid line: present invention (FIG. 7), dashed curve: comparative example (FIG. 6)). As represented by the dashed curve, in the eddy current magnetic field of the comparative example, a magnetic field of high even order components (components of the secondary order, fourth order, etc.) exists line symmetrically with z=0 as the symmetry axis. This magnetic field of even order components cannot be compensated by a gradient magnetic field correction pulse (having the primary component), and accordingly remain as an error magnetic field. Accordingly, this magnetic field of high even order components needs to be made low in advance. On the other hand, the eddy current magnetic field in the first embodiment of the present invention is constant in magnetic field intensity of z-component, wherein neither a magnetic field of the primary component nor a magnetic field of high even order components exists. Accordingly, a gradient magnetic field with high accuracy can be generated. For example, even when a magnetic field of the primary component is applied from an external device, an error magnetic field can be completely cancelled by compensating with a gradient magnetic field correction pulse, which enables generation of a gradient magnetic field with high accuracy.

Figure 8B:
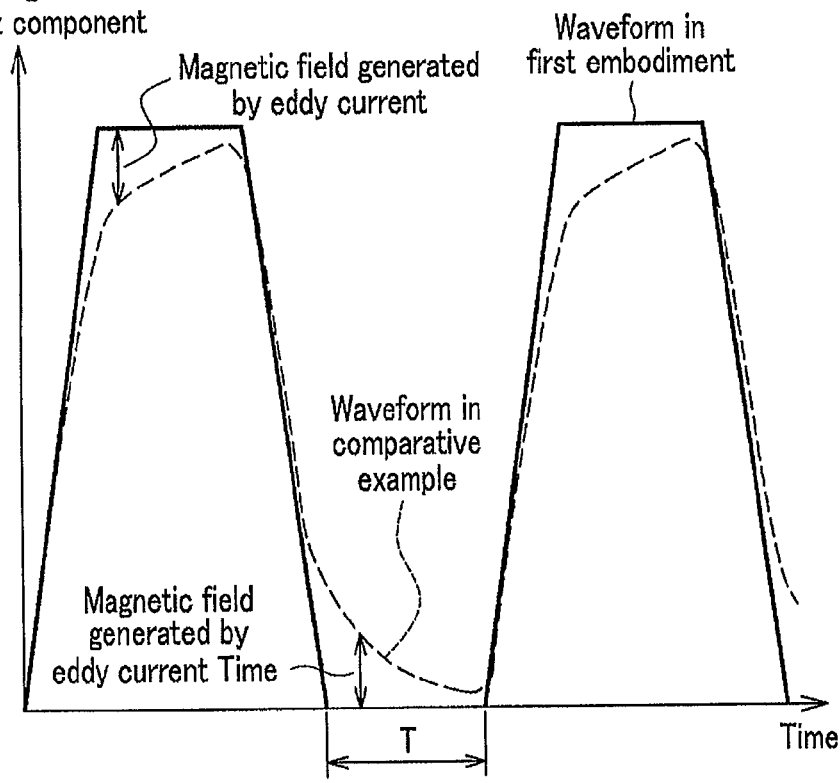
FIG. 8B is a diagram showing the pulse waveform of the magnetic flux density of z-component of a magnetic field generated by eddy currents at point a in FIG. 8A (solid line: present invention (FIG. 7), dashed curve: comparative example)

FIG. 8B shows the pulse waveform of the magnetic flux density of z-component of a magnetic field (eddy current magnetic field) generated by eddy currents at point in FIG. 8A (solid line: present invention, dashed curve: comparative example). As shown, the pulse waveform in the first embodiment of the present invention represented by the solid line is distorted little. On the other hand, the pulse waveform in the comparative example represented by the dashed curve is more distorted, compared with the pulse waveform in the first embodiment. If the damping time constant of eddy currents is large, the eddy current magnetic field cannot be sufficiently damped during the temporal interval between pulses, the error is accumulated more and more as time goes by, and it is necessary to set the damping time constant small. In this situation, in the first embodiment, the coil wires 37a, 37b in the central region 3d are narrowed to thereby reduce the induced electromotive force and reduce eddy currents. Further, as the coil wires 37a, 37b in the central region 3d are narrowed, the electrical resistance is increased and the damping time constant is decreased.

Incidentally, it has been described about narrowing the coil wires 37a, 37b, of the y-direction gradient magnetic field main coil 3y, in the central region 3d, this does not apply to the gradient magnetic field shield coil 4 (see FIG. 2) including the y-direction gradient magnetic field shield coil 4y (see FIG. 2). As the gradient magnetic field shield coil 4 (y-direction gradient magnetic field shield coil 4y) is magnetically shielded, as shown in FIG. 4, a magnetic field (magnetic flux lines 15) interlinked with the y-direction gradient magnetic field shield coil 4y is little, compared with the case of the y-direction gradient magnetic field main coil 3y. This is because, eddy currents are accordingly generated little in the gradient magnetic field shield coil 4 (y-direction gradient magnetic field shield coil 4y), and an eddy current magnetic field is generated little.

On the other hand, similarly to the y-direction gradient magnetic field main coil 3y, the coil wire, in the central region 3d, of the x-direction gradient magnetic field main coil 3x (see FIG. 2), is preferably narrowed. The x-direction gradient magnetic field main coil 3x has a structure that enables superimposing the x-direction gradient magnetic field main coil 3x on the y-direction gradient magnetic field main coil 3y in such a manner of rotating the y-direction gradient magnetic field main coil 3y by 90 degrees around z-axis and radially enlarging or reducing. This x-direction gradient magnetic field main coil 3x also makes it possible to obtain distribution of magnetic field lines 15, 16 in such a manner that y-axis in the distribution diagram of the magnetic field lines 15, 16 in FIG. 4 and FIG. 7 is rewritten into x-axis, and obtain advantages similar to those of the y-direction gradient magnetic field main coil 3y regarding reduction in generation of eddy currents and the like.

Further, in case of making the eddy current magnetic field generated in the image capturing space 9 lower than or equal to ½ of a conventional case, the wire width L1 of the coil wires in the central region 3d is desirably made smaller than or equal to ½ of a conventional case and the wire width L2 of the coil wires in the outside-central region 3e is desirably made smaller than or equal to ½ of a conventional case. This is because the magnetic moment of eddy currents flowing in the surface of the coil conductor, eddy currents being the source of the eddy current magnetic field, is proportional to the wire width L1.

Still further, distance D1 of the central region 3d from the central plane 3c is desirably made in a range that is generated by the magnetic field 17 (see 4) in the direction reverse to the direction of the y-direction magnetic field 17 (see FIG. 4) generated at the position of the spiral center 36. For example, distance D1 of the central region 3d from the central plane 3c is made substantially the same as radius R of the image capturing space 9 substantially in a spherical shape (D1=R). This is because this magnetic field 17 in the reverse direction generates an eddy current magnetic field of high even orders.

Second Embodiment

FIG. 9 is a perspective view of the y-direction gradient magnetic field main coil 3y in a second embodiment of the present invention. The y-direction gradient magnetic field main coil 3y in the second embodiment is different from the y-direction gradient magnetic field main coil 3y in the first embodiment in that coil wires 37a, 37b are provided with fins 39 extending along the direction of the adjacent coil wires. The fins 39 are divided by slits 39a arranged along a direction perpendicular to the direction of the extension of the coil wires 37a, 37b provided with the fins 39. Concretely, the wire widths of the coil wires 37a, 37b in the central region 3d are not simply narrowed, but slits 39a along the direction perpendicular to the direction of currents (the extending direction of the coil wires 37a, 37b) flowing in the coil wires 37a, 37b are arranged to narrow the wire widths, wherein the intervals between neighboring slits 39a are made approximately the widths of the coil wires 37a, 37b or shorter. Further, a current is prevented from entering inside the fins 39. A region where a current flows is narrowed to thereby increase the above-described electrical resistance and decrease the damping time constant. If a region where a current flows is merely narrowed, the amount of heat generation increases. However, by the fins 39 between the slits 39a arranged perpendicular to the direction of current, the generated heat can be discharged by heat transfer, which makes it possible to reduce rapid increase in the temperature.

Third Embodiment

Figure 10:
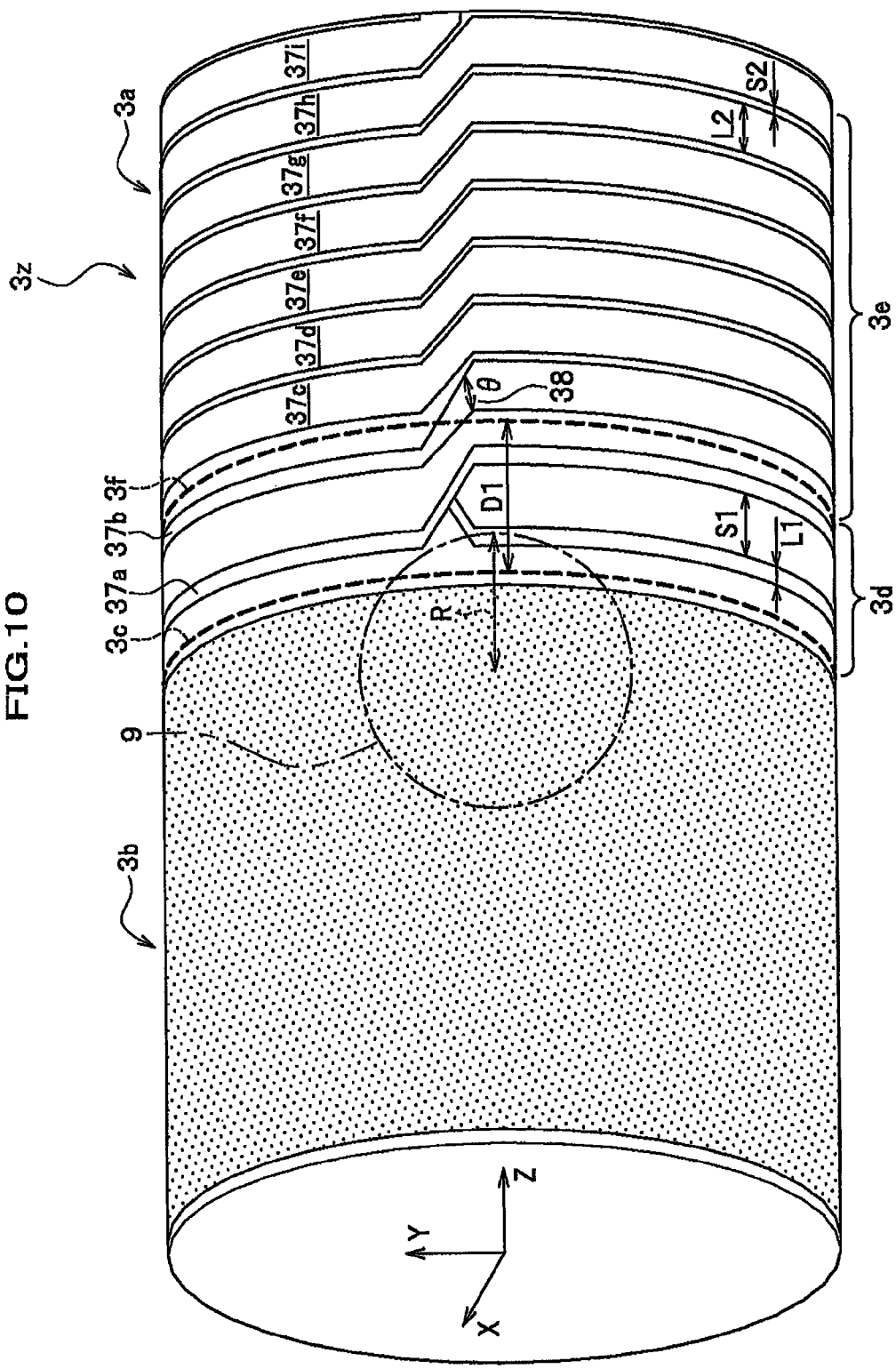
FIG. 10 is a perspective view of a z-direction gradient magnetic field main coil of a magnetic resonance imaging device (gradient magnetic field coil device) in a third embodiment of the present invention.

FIG. 10 is a perspective view of a z-direction gradient magnetic field main coil 3z in the third embodiment of the present invention. The z-direction gradient magnetic field main coil 3z includes a forward coil 3a and a reverse coil 3b facing the forward coil 3a such that these coils sandwich the central plane 3c. The forward coil 3a and the reverse coil 3b are helical coils formed along a tube shape. Incidentally, the cross-sectional shape perpendicular to the central axis of the hollow cylinder, along which the forward coil 3a and the reverse coil 3b are arranged, may be an elliptical shape, a race truck shape, or the like without being limited to a circular shape. By making the cross-sectional shape be an elliptical shape, a race truck shape, or the like, the width by the diameter in x-direction of the z-direction gradient magnetic field main coil 3z can be made larger than the width by the diameter in y-direction. As the width in x-direction, which is to be the direction of the shoulder-width of the subject 7, can be widen, the subject 7 can enter the image capturing space 9 in a natural posture. By applying current to the forward coil 3a and the reverse coil 3b in the directions reverse to each other, a gradient magnetic field with the gradient of a magnetic field intensity in z-direction can be generated in the image capturing space 9 in the periphery of the central plane 3c. The central plane 3c can be disposed such as to agree with z=0 plane (x-y plane including x-axis and y-axis).

As shown in FIG. 10, the coil pattern of the forward coil 3a is a helical pattern. Though not shown in FIG. 10, the coil pattern of the reverse coil 3b is substantially symmetrical to the coil pattern of the forward coil 3a with z=0 plane (xy-plane including x-axis and y-axis) as the plane of symmetry. That is, the coil pattern of the reverse coil 3b can be guessed from the coil pattern of the forward coil 3a. Incidentally, in order to be formed thin in thickness, the forward coil 3a and the reverse coil 3b, the forward coil 3a and the reverse coil 3b are manufactured by cutting out a helical coil wire from a tube of good conductor, such as copper (Cu) or aluminum (Al). As a method of cutting out a spiral shape from a tube, a method by etching, water jet, punching, or the like can be used. Based on current distribution that is optimally designed in order to form a desired gradient magnetic field, a tube is processed such as to form a conductive region by a region that is cut out and separated for a required individual maximum current value.

The forward coil 3a includes a central region 3d adjacent to the central plane 3c and a outside-central region 3e at a longer distance than the central region 3d from the central plane 3c. The coil wires 37a, 37b on the reverse coil 3b side are disposed in the central region 3d, and coil wires 37c-37i on the side opposite to the reverse coil 3b are disposed in the outside-central region 3e, with the coil wires 37a, 37b between the reverse coil 3b and the coil wires 37c-37i. The coil wires 37a-37i are arranged along the central plane 3c.

The wire width L1 of the coil wires 37a, 37b in the central region 3d is smaller than the wire width L2 of the coil wires 37c-37i in the outside-central region 3e (L1<L2). The interval S1 between the neighboring coil wires 37a, 37b in the central region 3d is larger than the interval S2 between the neighboring coil wires 37c-37i in the outside-central region 3e (S1>S2). The wire width L1 of the coil wires 37a, 37b in the central region 3d are smaller than the interval S1 between the coil wires 37a, 37b in the central region 3d (L1<S1) is smaller than the S1 between the coil wires 37a, 37b in the central region 3d (L1<S1). The wire width L2 of the coil wires 37c-37i in the outside-central region 3e is larger than the interval S2 between the neighboring coil wires 37c-37i on the outside-central region 3e (L2>S2).

The central region 3d and the outside-central region 3e are partitioned by the boundary surface 3f. The boundary surface 3f can be disposed such as to agree with z=D1 plane (x-y plane distant from z=0 plane by distance D1). Distance D1 is substantially equal to radius R of the image capturing space 9 substantially in spherical shape (D1=R). The boundary surface 3f is parallel with the central plane 3c. The coil wire 37b and the coil wire 37c are connected by a taper 38, which is a crossover line. The taper 38 passes through the boundary surface 3f between the central region 3d and the outside-central region 3e. The taper 38 is provided adjacent to the boundary surface 3f. The taper 38 has a taper angle θ in a range from 5 degrees to 120 degrees. The line width of the taper 38 gradually becomes narrower as goes from the outside-central region 3e to the central region 3d. The coil wires 37a-37i are distant from the boundary surface 3f. In the third embodiment also, as it is possible to decrease the width of the coil wires 37a, 37b in the central region 3d, it is possible to reduce eddy currents similarly to the first embodiment. As the coil wires 37a, 37b can be narrowed, the electrical resistance becomes high so that the damping time constant can be made small.

Fourth Embodiment

Figure 11:
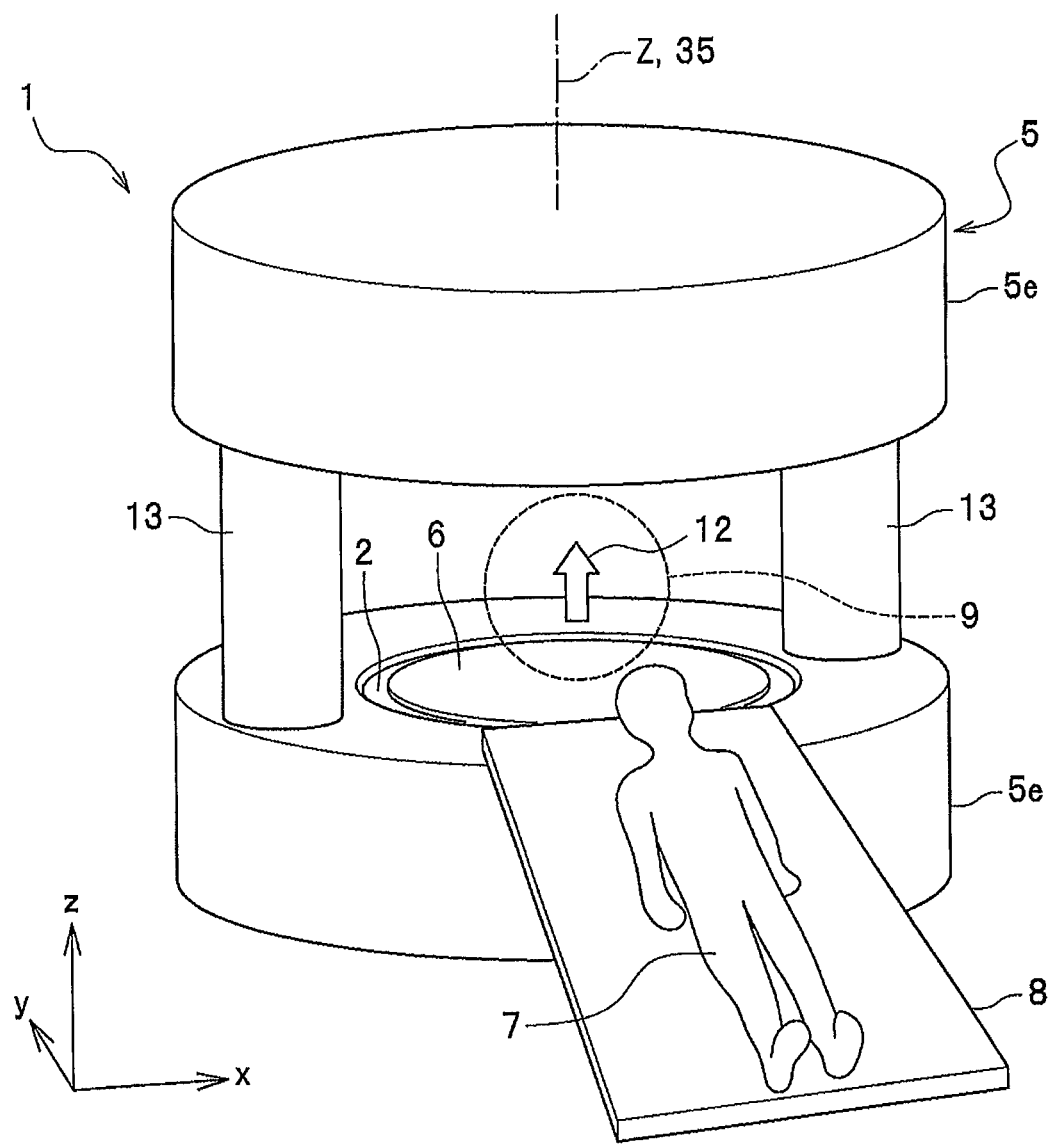
FIG. 11 is a perspective view of a magnetic resonance imaging device in a fourth embodiment of the invention.

FIG. 11 is a perspective view of a MRI device in a fourth embodiment of the invention. While the MRI device 1 in the first embodiment shown in FIG. 3 is a horizontal magnetic field MRI device in which the direction of the static magnetic field 12 is horizontal, the MRI device 1 in the fourth embodiment shown in FIG. 11 is a vertical magnetic field MRI device in which the direction of the static magnetic field 12 is vertical. The MRI device 1 is disposed such as to sandwich the image capturing space 9 into which a subject 7 lying on a bed 8 is inserted, and includes static magnetic field coil devices 5 that are vertically paired and generate a uniform static magnetic field 12 in the image capturing space 9, connecting posts for supporting the vertical pair of the static magnetic field coil devices 5 in a separate state, gradient magnetic field coil devices 2 for generating a pulsed gradient magnetic field whose magnetic field intensity is spatially inclined with gradient to assign position information to the image capturing space 9, RF coils 6 for irradiating the subject 7 inserted in the image capturing space 9 with a high frequency pulse, a receiving coil (not shown) for receiving magnetic resonance signals from the subject 7, and a computer system (not shown) that processes the received magnetic resonance signals and displays a tomographic image of the subject 7. The vertically paired static magnetic field coil devices 5, the gradient magnetic field coil devices 2, and the RF coils 6 are in circular disc (cylindrical) shapes with the central axis 35 as a common axis. The subject 7 is transported by the movable bed 8 to the image capturing space 9, however, the subject 7 can see the surroundings, and a closed feeling is reduced because the vertical pair of static magnetic field coil devices 5 are connected with each other only by the thin connecting posts 13. Z-axis is set in the vertical direction parallel to the central axis 35, and x-axis and y-axis are set in the horizontal direction such as to be perpendicular to each other.

Figure 12:
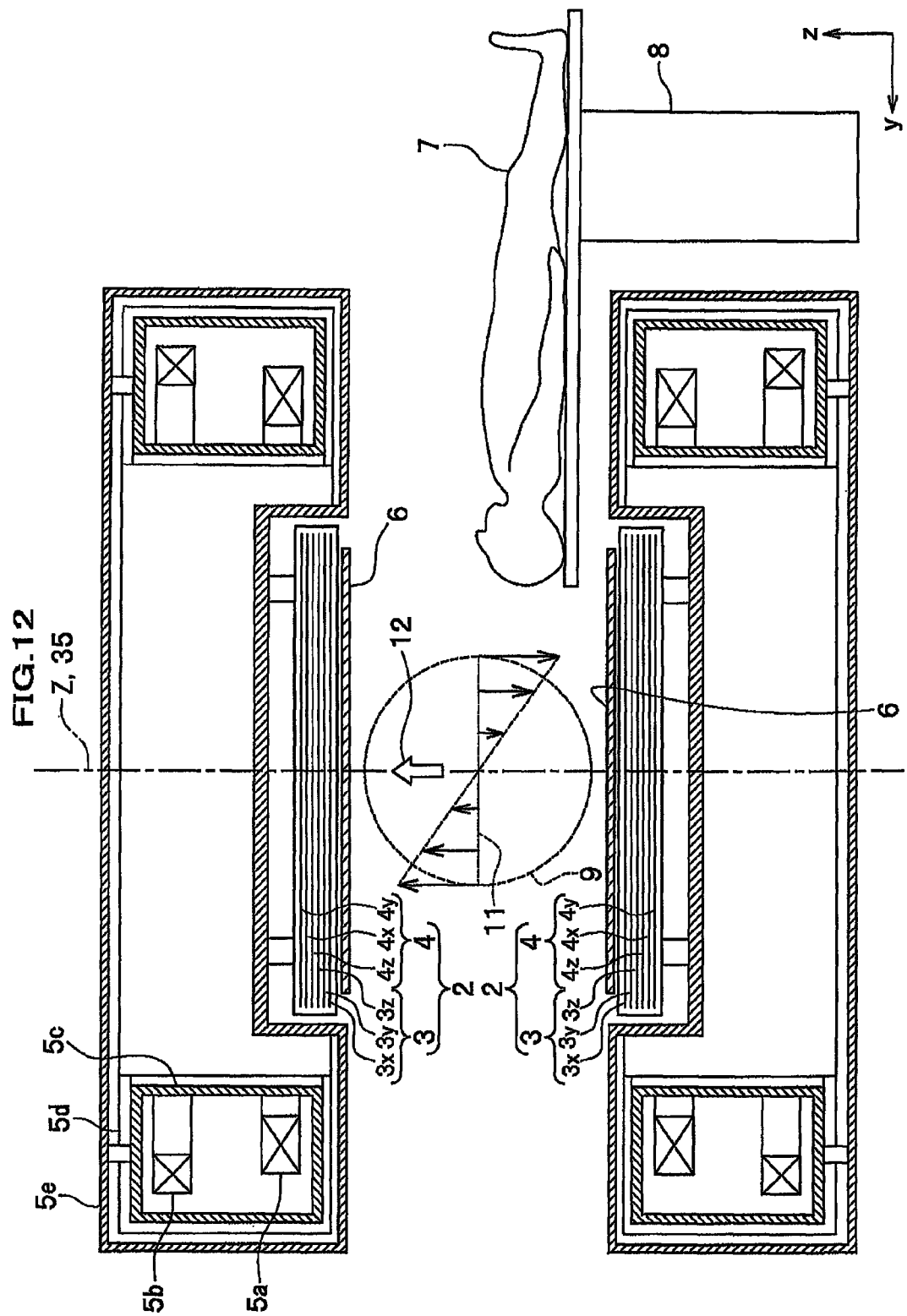
FIG. 12 is a cross-sectional view of the magnetic resonance imaging device, in the fourth embodiment of the present invention, cut by y-z plane including the central axis (z axis)

FIG. 12 is a cross-sectional view of the magnetic resonance imaging device 1, in the fourth embodiment of the present invention, cut by y-z plane including the central axis 35 (z axis). As the vertically paired static magnetic field coil devices 5, vertically paired static magnetic field main coils 5a and vertically paired static magnetic-field shield coils 5b are used. The vertically paired static magnetic field main coils 5a and the vertically pared static magnetic-field shield coils 5b respectively have annular shapes with the central axis 35 as the axis of the annular shapes. The vertically paired static magnetic field main coils 5a and the vertically pared static magnetic-field shield coils 5b are housed in a housing with a three-layer structure of a helium container 5c, a radiation shield 5d, and vacuum housing 5e similarly to the first embodiment.

The gradient magnetic field coil devices 2 are also provided in a vertical pair, and the vertically paired gradient magnetic field coil devices 2 are disposed higher and lower, with the image capturing space 9 therebetween. The RF coils 6 are also provided in a vertical pair, and the vertical pair of RF coils 6 are disposed higher and lower, with the image capturing space 9 therebetween. The subject 7 is lying on the bed 8 and is inserted between the RF coils 6 vertically separated. The gradient magnetic field coil devices 2 are a pair of coils in a flat plate shape formed on respective parallel planes, and are placed inside the recessions, of the respective vacuum housings 5e, formed adjacent to the image capturing space 9. The RF coils 6 are arranged on the image capturing space 9 side of the respective gradient magnetic field coil devices 2. The vertically paired gradient magnetic field coil devices 2 generate a gradient magnetic field 11 in a pulsed shape, which is a magnetic field in the same direction as the static magnetic field 12 and has a magnetic field intensity inclined in an arbitrary direction. Ordinarily, z-axis is set in the direction of the static magnetic field 12, and x-axis and y-axis are set in two directions perpendicular to z-axis, wherein the gradient magnetic field coil devices 2 have a function to generate a gradient magnetic field 11 being independent in the three directions of x-axis direction, y-axis direction, and z-axis direction, superimposing the gradient magnetic field 11 on the static magnetic field 12.

The gradient magnetic field coil devices 2 have a pair of circular disc shapes and are disposed such as to sandwich the RF coils 6 and the image capturing space 9 by the pair of circular discs. The each gradient magnetic field coil device 2 includes a z-direction gradient magnetic field main coil 3z, an x-direction gradient magnetic field main coil 3x, and a y-direction gradient magnetic field main coil 3y. FIG. 12 shows an example where the y-direction gradient magnetic field main coils 3y generate the gradient magnetic field 11 whose magnetic intensity linearly varies along y-axis direction. The RF coils 6 also have a pair of circular disc shapes and are disposed such as to sandwich the image capturing space 9. The gradient magnetic field coil devices 2 have a gradient magnetic field main coil 3 and a gradient magnetic field shield coil 4. The gradient magnetic field main coil 3 includes a pair of plate shaped z-direction gradient magnetic field main coils 3z, a pair of plate shaped x-direction gradient magnetic field main coils 3x, and a pair of plate shaped y-direction gradient magnetic field main coils 3y. The gradient magnetic field shield coil 4 includes a pair of plate shaped z-direction gradient magnetic field shield coils 4z, a pair of plate shaped x-direction gradient magnetic field shield coils 4x, and a pair of plate shaped y-direction gradient magnetic field shield coils 4y.

Figure 13:
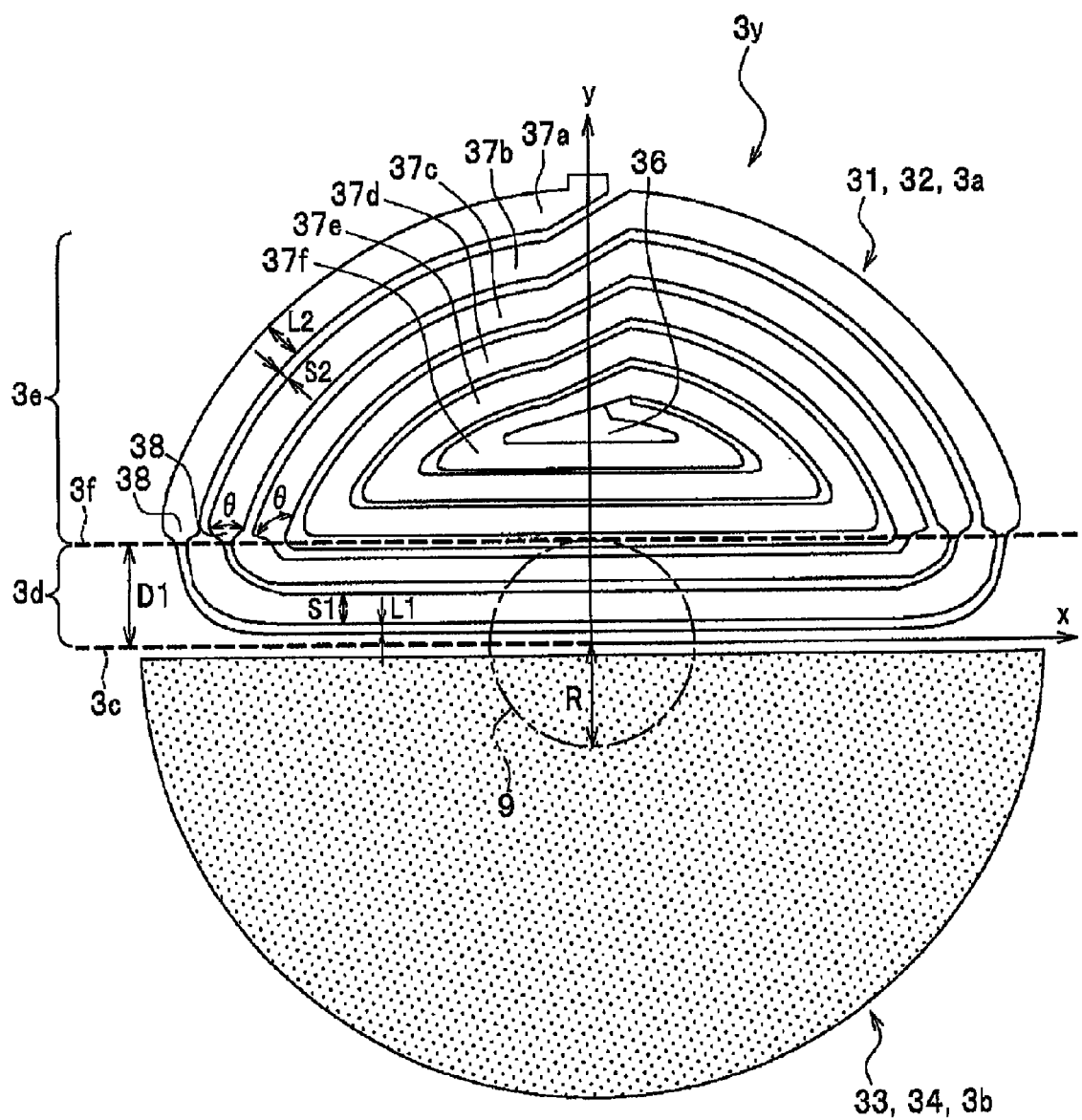
FIG. 13 is a plan view of the first forward coil (the second forward coil) and the first reverse coil (the second reverse coil) of the y-direction gradient magnetic field main coils of the magnetic resonance imaging device (gradient magnetic field coil device) in the fourth embodiment of the present invention.

FIG. 13 is a plan view of the first forward coil 31 (the second forward coil 32) and the first reverse coil 33 (the second reverse coil 34) of the y-direction gradient magnetic field main coils 3y in the fourth embodiment of the present invention. The y-direction gradient magnetic field main coils 3y, which are in vertically paired plate shapes, are arranged such that the first forward coil 31 and the first reverse coil 33 are disposed on the upper one side of the pair, and the second forward coil 32 and the second reverse coil 34 are disposed on the lower side of the pair. The first forward coil 31 and the first reverse coil 33 are disposed on a plane on the upper side, the second forward coil 32 and the second reverse coil 34 are disposed on a plane on the lower side, and the coils 31-34 are disposed on the parallel planes.

The outer shapes of the first forward coil 31 and the first reverse coil 33 are semicircles. The first forward coil 31 and the first reverse coil 33 together form a substantially circular shape. The coil pattern of the first forward coil 31 is a spiral shaped pattern of plural turns (six turns in the example in FIG. 13) for which a coil wire 37a, a coil wire 37b, a coil wire 37c, a coil wire 37d, a coil wire 37e, and a coil wire 37f are disposed on inner side in this order. The coil pattern of the second forward coil 32 is substantially plane symmetrical to the coil pattern of the first forward coil 31, with z=0 plane (xy-plane including x-axis and y-axis) as the plane of symmetry. The coil pattern of the first reverse coil 33 is, though not shown in FIG. 13, substantially symmetrical to the coil pattern of the first forward coil 31, with y=0 plane (zx-plane including z-axis and x-axis) as the plane of symmetry. The coil pattern of the second reverse coil 34 is substantially symmetrical to the coil pattern of the first reverse coil 33, with z=0 plane (xy-plane including x-axis and y-axis) as the plane of symmetry. The coil patterns of the second forward coil 32 and the second reverse coil 34 are substantially congruent with those of the first forward coil 31 and the first reverse coil 33. Thus, it is possible to guess the coil patterns of the second forward coil 32, the first reverse coil 33, and the second reverse coil 34 from the coil pattern of the first forward coil 31. Incidentally, in order to be formed thin in thickness, the first forward coil 31, the second forward coil 32, the first reverse coil 33, and the second reverse coil 34 are manufactured by cutting out a spiral coil wire from a plate of good conductor, such as copper (Cu) or aluminum (Al). As a method of cutting out a spiral shape from a plate, a method by etching, water jet, punching, or the like can be used. Based on current distribution that is optimally designed in order to form a desired gradient magnetic field, a plate is processed such as to form a conductive region by a region that is cut out and separated for a required individual maximum current value. Then, by applying a current to the second forward coil 32 in the same direction as the direction of a current applied to the first forward coil 31 and applying a current to the first reverse coil 33 and the second reverse coil 34 in the direction reverse to the direction of the current in the first forward coil 31, it is possible to generate a gradient magnetic field 11, whose magnetic field intensity is inclined in y-axis direction, in the image capturing space 9.

The coil pattern of the first forward coil 31 will be described later in detail. The first forward coil 31 includes a central region 3d adjacent to the central plane 3c and a outside-central region 3e at a distance larger than the distance of the central region 3d from the central plane 3c. The central plane 3c can be set to y=0 plane (z-x plane including z-axis and x-axis). The first forward coil 31 in a spiral shape has a spiral center 36 still inner than the coil wire 37f on the most inner side. The spiral center 36 is arranged in the outside-central region 3e. The central region 3d is disposed closer to the central plane 3c than the spiral center 36 is. The coil wires 37a, 37b, and 37c on the outer side are disposed such as to straddle the central region 3d and the outside-central region 3e. The coil wires 37d, 37e, and 37f, which are inside the coil wires 37a, 37b, and 37c, are disposed in the outside-central region 3e. The coil wires 37a, 37b, and 37c in the central region 3d are arranged along the central plane 3c.

The wire width L1 of the coil wires 37a, 37b, and 37c in the central region 3d is smaller than the wire width L2 of the coil wires 37a-37f in the outside-central region 3e (L1<L2). The interval S1 between the coil wires 37a, 37b, 37c in the central region 3d are wider than the interval S2 between the neighboring coil wires 37a-37f in the outside-central region 3e (S1>S2). The wire width L1 of the coil wires 37a, 37b, and 37c in the central region 3d is smaller than the interval S1 between the coil wires 37a, 37b, and 37c in the central region 3d (L1<S1). The wire width L2 of the coil wires 37a-37f in the outside-central region 3e is larger than the interval S2 between the neighboring coil wires 37a-37f in the outside-central region 3e (L2>S2).

The central region 3d and the outside-central region 3e are partitioned by the boundary surface 3f. The boundary surface 3f can be disposed such as to agree with y=D1 plane (z-x plane distant from y=0 plane by distance D1). Distance D1 is substantially equal to radius R of the image capturing space 9 substantially in spherical shape (D1=R). The boundary surface 3f is parallel with the central plane 3c. The coil wires 37a, 37b, and 37c pass through the boundary surface 3f between the central region 3d and the outside-central region 3e. The coil wires 37a, 37b, and 37c on the outer side have a taper 38 with a taper angle θ in the vicinity of the boundary surface 3f, wherein the taper angle θ is in a range from 20 degrees to 160 degrees. With the taper 38, the wire width of the outer coil wires 37a, 37b, and 37c gradually becomes smaller as going from the outside-central region 3e to the central region 3d. On the other hand, the coil wires 37d, 37e, and 37f inside the coil wires 37a, 37b, 37c are distant from the boundary surface 3f.

Similarly to the each y-direction gradient magnetic field main coil 3y, the coil wire, in the central region 3d, of the each x-direction gradient magnetic field main coil 3x (see FIG. 12), is preferably narrowed. The each x-direction gradient magnetic field main coil 3x has a structure obtained by rotating the corresponding y-direction gradient magnetic field main coil 3y by 90 degrees around z-axis. Also by these x-direction gradient magnetic field main coils 3x, the same advantages similar to those in the first embodiment can be obtained on reducing generation of eddy currents or the like, similarly to the y-direction gradient magnetic field main coils 3y.

Fifth Embodiment

Figure 14:
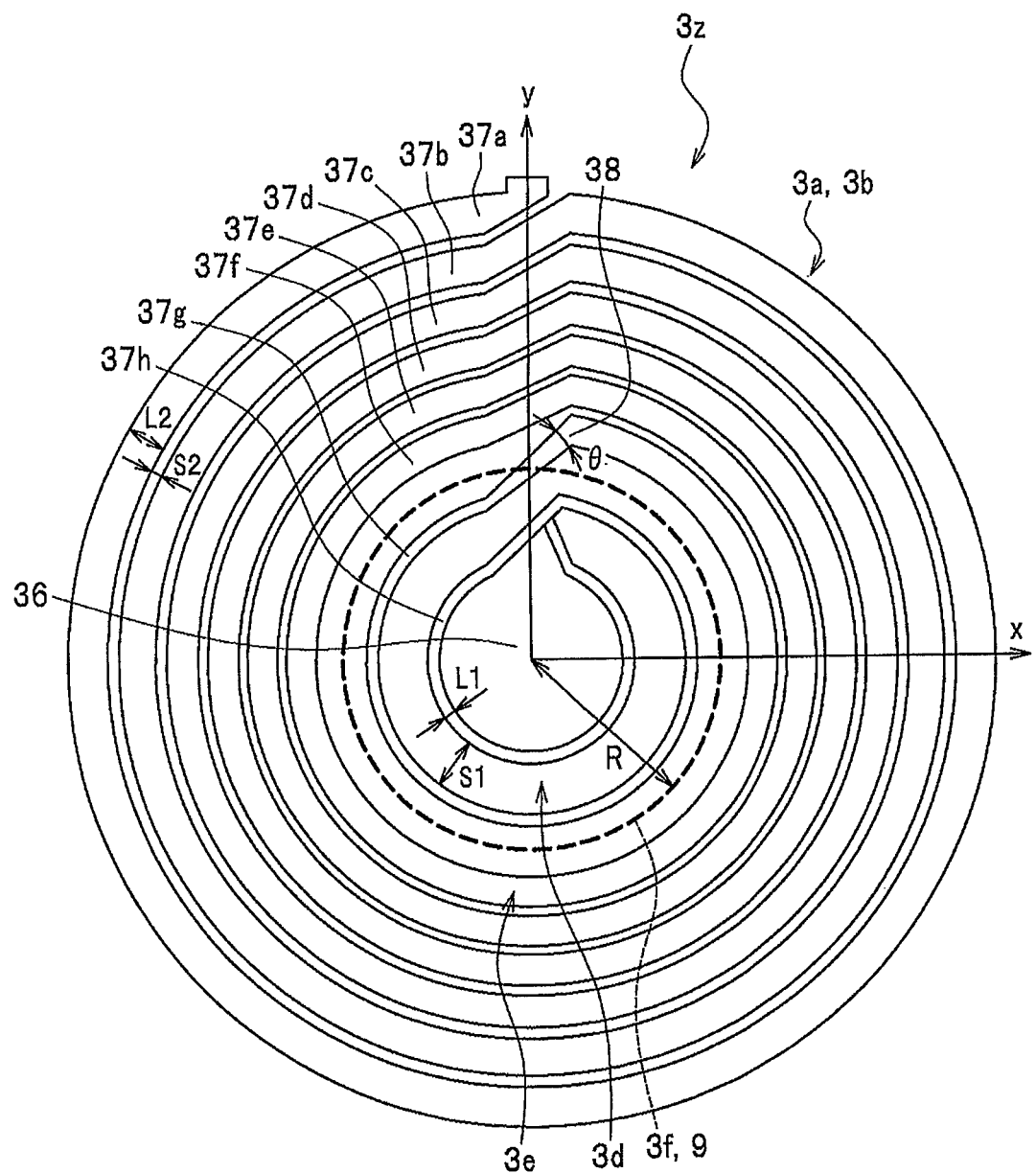
FIG. 14 is a plan view of the forward coil (the reverse coil) of z-direction gradient magnetic field main coils of a magnetic resonance imaging device (gradient magnetic field coil device) in the fifth embodiment of the present invention.

FIG. 14 is a plan view of the forward coil 3a (a reverse coil 3b) of z-direction gradient magnetic field main coils 3z in a fifth embodiment of the present invention. The z-direction gradient magnetic field main coils 3z, which are in vertically paired plate shapes, are arranged such that a forward coil 3a is disposed on the upper one side of the pair, and the reverse coil 3b is disposed on the lower one side of the pair. The forward coil 3a is disposed on a plane on the upper side of the central plane (z=0 plane (x-y plane including x-axis and y-axis)), and the reverse coil 3b is disposed on a plane on the lower side of the central plane, wherein the coils 3a, 3b are disposed on the parallel planes such as to sandwich the central plane. The respective outer shapes of the forward coil 3a and the reverse coil 3b are substantially semicircular shapes. The coil pattern of the forward coil 3a is a spiral shaped pattern of plural turns (eight turns in the example in FIG. 14) for which a coil wire 37a, a coil wire 37b, a coil wire 37c, a coil wire 37d, a coil wire 37e, a coil wire 37f, a coil wire 37g, and a coil wide 37h are disposed on inner side in this order. The coil pattern of the reverse coil 3b is substantially plane symmetrical to the coil pattern of the forward coil 3a, with z=0 plane (xy-plane including x-axis and y-axis) as the plane of symmetry. Thus, the coil pattern of the reverse coil 3b can be guessed from the coil pattern of the forward coil 3a. Incidentally, in order to be formed thin in thickness, the forward coil 3a and the reverse coil 3b are manufactured by cutting out a spiral coil wire from a plate of good conductor, such as copper (Cu) or aluminum (Al). As a method of cutting out a spiral shape from a plate, a method by etching, water jet, punching, or the like can be used. Based on current distribution that is optimally designed in order to form a desired gradient magnetic field, a plate is processed such as to form a conductive region by a region that is cut out and separated for a required individual maximum current value. Then, by applying a current to the reverse coil 3b in the direction reverse to the direction of a current applied to the forward coil 3a, it is possible to generate a gradient magnetic field, whose magnetic field intensity is inclined in z-axis direction, in the image capturing space 9.

The coil pattern of forward coil 3a will be described later in detail. The forward coil 3a includes a central region 3d adjacent to the central axis (z-axis) of the forward coil 3a, and a outside-central region 3e at a distance larger than the distance of the central region 3d from the central axis (z-axis) of the forward coil 3a. The forward coil 3a in a spiral shape has a spiral center 36 still inner than the coil wire 37h on the most inner side. The spiral center 36 is arranged on the central axis (z-axis) of the forward coil 3a. The spiral center 36 is disposed in the central region 3d. The central region 3d and the outside-central region 3e are partitioned by a boundary surface 3f. The boundary surface 3f can be arranged on a side surface of a hollow cylinder with z-axis as the central axis. The radius of the hollow cylinder is substantially equal to the radius R of the semispherical image capturing space 9. The coil wire 37f and the coil wire 37g are connected by a taper 38, which is a crossover line. The taper 38 passes through the boundary surface 3f between the central region 3d and the outside-central region 3e. The taper 38 is provided adjacent to the boundary surface 3f. The taper 38 has a taper angle θ in a range from 5 degrees to 120 degrees. The line width of the taper 38 gradually becomes narrower as goes from the outside-central region 3e to the central region 3d. The coil wires 37a-37h are distant from the boundary surface 3f. The outer coil wires 37a-37f are disposed in the outside-central region 3e, and the coil wires 37g, 37h inside the coil wires 37a-37f are disposed in the central region 3d. The coil wires 37g, 37h are arranged along the boundary surface 3f.

The wire width L1 of the coil wires 37g, 37h in the central region 3d is smaller than the wire width L2 of the coil wires 37a-37f in the outside-central region 3e (L1<L2). The interval S1 between the coil wires 37g, 37h in the central region 3d are wider than the interval S2 between the neighboring coil wires 37a-37f in the outside-central region 3e (S1>S2). The wire width L1 of the coil wires 37g, 37h in the central region 3d is smaller than the interval S1 between the coil wires 37g, 37h in the central region 3d (L1<S1). The wire width L2 of the coil wires 37a-37f in the outside-central region 3e is larger than the interval S2 between the neighboring coil wires 37a-37f in the outside-central region 3e (L2>S2). In the fifth embodiment also, as it is possible to decrease the width of the coil wires 37g, 37h in the central region 3d, it is possible to reduce eddy currents similarly to the first embodiment. As the coil wires 37g, 37h in the central region 3d are narrowed, the electrical resistance becomes high so that the damping time constant can be made small.

The invention is not limited to the foregoing first to fifth embodiments, and includes various modified and changed examples. For example, the foregoing first to fifth embodiments have been described in detail for better understandings of the invention, however, the invention is not necessarily limited to embodiments including all the above-described arrangements. Further, a part of arrangement in a certain embodiment can be replaced by arrangement in another embodiment, and arrangement in a certain embodiment can also be added with arrangement of another embodiment. Still further, a part of arrangements of the respective embodiments can also be added with, deleted by, and replaced by other arrangements.

REFERENCE SYMBOLS

1: magnetic resonance imaging (MRI) device
2: gradient magnetic field coil device
3, 3x, 3y, 3z: gradient magnetic field main coil
3a: forward coil
31: first forward coil
32: second forward coil
3b: reverse coil
33: first reverse coil
34: second reverse coil
3c: central plane
3d: central region
3e: outside-central region
3f: boundary surface between central region and outside-central region
35: central axis (z-axis)
36: spiral center
37a, 37b, 37c, 37d, 37e, 37f, 37g, 37h: coil wire
38: taper (gradient section)
39: fin
39a: slit
5: static magnetic field coil device
9: image capturing space
11: gradient magnetic field
14: eddy current L1: wire width of coil wire in central region
L2: wire width of coil wire in outside-central region
S1: interval between coil wires in central region
S2: interval between coil wires in outside-central region
R: radius of image capturing space
D1: distance from boundary surface to central plane
θ: taper angle (gradient angle)

The invention claimed is:

1. A gradient magnetic field coil device, comprising:
a forward coil; and
a reverse coil that faces the forward coil across a central plane and generates a gradient magnetic field in a periphery of the central plane by application of a current in a direction reverse to a direction of a current applied to the forward coil,
wherein at least one coil of the forward coil and the reverse coil includes a central region between a spiral center of the coil and the central plane, and includes an outside-central region at a greater distance than a distance of the central region from the central plane,
and wherein a wire width of a coil wire of the coil in the central region is less than a wire width of the coil wire of the coil in the outside-central region, along an axial dimension that is perpendicular to the central plane and intersects the spiral center of the coil.

2. The gradient magnetic field coil device according to claim 1, wherein an interval, in the central region, between coil wires is greater than an interval, in the outside-central region, between the coil wires.

3. The gradient magnetic field coil device according to claim 2, wherein a wire width, in the central region, of a coil wire is less than or equal to ½ of a wire width, in the outside-central region, of the coil wire.

4. The gradient magnetic field coil device according to claim 1, wherein a wire width, in the central region, of a coil wire is less than or equal to ½ of a wire width, in the outside-central region, of the coil wire.

5. The gradient magnetic field coil device according to claim 1, wherein a direction of a magnetic field generated by application of the current to the coil and interlinked with the coil is reverse in the central region to a direction in the outside-central region.

6. The gradient magnetic field coil device according to claim 1, wherein the coil wire has a taper having a taper angle in a range from 5 degrees to 160 degrees adjacent to a boundary between the central region and the outside-central region,
and wherein the coil wire has a wire width that is narrowed by the taper as going from the outside-central region into the central region.

7. The gradient magnetic field coil device according to claim 1, wherein a coil wire in the central region is arranged along the central plane.

8. The gradient magnetic field coil device according to claim 1,
wherein coil wires have a wire width, in the central region, less than an interval, in the central region, between the coil wires,
and wherein the coil wires have a wire width, in the outside-central region, greater than an interval, in the outside-central region, between the coil wires.

9. The gradient magnetic field coil device according to claim 1,
wherein coil wires in the central region are provided with respective fins extending along a direction of the neighboring coil wires,
and wherein the fins are divided by slits arranged along a direction perpendicular to the direction of the coil wires provided with the slits.

10. The gradient magnetic field coil device according to claim 1,
wherein the forward coil and the reverse coil are spiral coils,
wherein a spiral center of the each spiral coil is disposed on a central axis of the coil,
wherein a boundary surface between the central region and the outside-central region is disposed on a side surface of a hollow cylinder,
and wherein the spiral center of the each spiral coil is disposed in the outside-central region.

11. The gradient magnetic field coil device according to claim 1,
wherein the forward coil and the reverse coil are spiral coils,
wherein the each central region is disposed closer to the central plane than a spiral center of the corresponding spiral coil,
and wherein a boundary surface between the central region and the outside-central region is disposed on a plane parallel to the central plane.

12. The gradient magnetic field coil device according to claim 11,
wherein the forward coil includes:
a first forward coil; and
a second forward coil that is disposed on a side of the first forward coil with respect to the central plane and faces the first forward coil,
and wherein the reverse coil includes:
a first reverse coil that is disposed on a side opposite to the first forward coil with respect to the central plane; and
a second reverse coil that is disposed on a side of the first reverse coil with respect to the central plane and faces the first reverse coil.

13. The gradient magnetic field coil device according to claim 12, wherein the first forward coil, the second forward coil, the first reverse coil, and the second reverse coil are saddle-shaped coils formed along a tube shape.

14. The gradient magnetic field coil device according to claim 13, wherein a cross-sectional shape perpendicular to a central axis of the tube along which the first forward coil, the second forward coil, the first reverse coil, and the second reverse coil are arranged is an elliptical shape or a race track shape.

15. The gradient magnetic field coil device according to claim 12, wherein the first forward coil, the second forward coil, the first reverse coil, and the second reverse coil are formed on parallel planes.

16. The gradient magnetic field coil device according to claim 1,
wherein the forward coil and the reverse coil are helical coils,
and wherein a boundary surface between the central region and the outside-central region is disposed on a plane parallel to the central plane.

17. The gradient magnetic field coil device according to claim 16, wherein a cross-sectional shape perpendicular to a central axis of a tube along which the forward coil and the reverse coil are arranged is an elliptical shape or a race track shape.

18. The gradient magnetic field coil device according to claim 1, comprising:
a gradient magnetic field shield coil that is arranged such as to cover the forward coil and the reverse coil to reduce leakage of a magnetic field generated by the forward coil and the reverse coil to outside.

19. A magnetic resonance imaging device, comprising:
a gradient magnetic field coil device that includes: a forward coil; and a reverse coil that faces the forward coil across a central plane and generates a gradient magnetic field in a periphery of the central plane by application of a current in a direction reverse to a direction of a current applied to the forward coil,
wherein at least one coil of the forward coil and the reverse coil includes a central region between a spiral center of the coil and the central plane, and includes a outside-central region at a greater distance than a distance of the central region from the central plane,
and wherein a wire width of a coil wire of the coil in the central region is less than a wire width of the coil wire of the coil in the outside-central region along an axial dimension that is perpendicular to the central plane and intersects the spiral center of the coil, and
wherein a static magnetic field coil device generates a static magnetic field in an image capturing space, superimposing the static magnetic field on the gradient magnetic field, and
wherein a radius of the image capturing space is equal to a distance from a boundary surface between the central region and the outside-central region to the central plane or the spiral center of the coil.

* * * * *